(12) United States Patent
Nguyen et al.

(10) Patent No.: US 9,072,165 B2
(45) Date of Patent: Jun. 30, 2015

(54) HOLLOW CONDUCTIVE GASKETS WITH CURVES AND OPENINGS

(75) Inventors: Anthony P. Nguyen, San Jose, CA (US); David P. Tarkington, Sunnyvale, CA (US); Peter N. Jezoirek, Mountain View, CA (US); Rico L. Zorkendorfer, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 92 days.

(21) Appl. No.: 13/527,482

(22) Filed: Jun. 19, 2012

(65) Prior Publication Data

US 2013/0333919 A1   Dec. 19, 2013

(51) Int. Cl.
*H05K 9/00* (2006.01)

(52) U.S. Cl.
CPC ..................... *H05K 9/0015* (2013.01)

(58) Field of Classification Search
CPC .................................... H05K 9/0015
USPC .................. 174/354, 355, 356, 357
See application file for complete search history.

(56) References Cited

U.S. PATENT DOCUMENTS

| 4,642,416 | A | * | 2/1987 | Rogner ........................ 174/357 |
| 4,684,762 | A | * | 8/1987 | Gladfelter ..................... 174/36 |
| 5,486,405 | A | | 1/1996 | Laves |
| 5,637,377 | A | | 6/1997 | Vermillion |
| 5,902,956 | A | | 5/1999 | Spies et al. |
| 6,667,092 | B1 | | 12/2003 | Brollier et al. |
| 6,784,363 | B2 | | 8/2004 | Jones |
| 6,870,092 | B2 | | 3/2005 | Lambert et al. |
| 6,943,287 | B2 | | 9/2005 | Lloyd et al. |
| 7,154,050 | B2 | * | 12/2006 | Sekijima et al. ............. 174/369 |
| 7,461,444 | B2 | | 12/2008 | Deaett et al. |
| 7,463,198 | B2 | | 12/2008 | Deaett et al. |
| 7,470,866 | B2 | | 12/2008 | Dietrich et al. |
| 7,732,714 | B2 | | 6/2010 | Hammaker et al. |
| 2003/0024718 | A1 | * | 2/2003 | Rubenstein et al. .......... 174/350 |
| 2003/0037943 | A1 | * | 2/2003 | Jensen et al. .................. 174/350 |
| 2006/0260838 | A1 | | 11/2006 | Ariel |
| 2009/0140499 | A1 | | 6/2009 | Kline |
| 2011/0244930 | A1 | | 10/2011 | Kong et al. |
| 2011/0253441 | A1 | * | 10/2011 | Doneker et al. .............. 174/350 |
| 2012/0061135 | A1 | | 3/2012 | Hill et al. |

FOREIGN PATENT DOCUMENTS

| WO | 9502953 | 1/1995 |
| WO | 2011140064 | 11/2011 |

OTHER PUBLICATIONS

Tarkington et al., U.S. Appl. 13/527,491, filed Jun. 19, 2012.
Jo Nakashima, "Snake," (image) [Retrieved on Apr. 10, 2012]. Retrieved from the Internet:<URL: http://i.ytimg.com/vi/0oj9g9gBAzw/0.jpg>.

* cited by examiner

*Primary Examiner* — Hung V Ngo
(74) *Attorney, Agent, or Firm* — Treyz Law Group; Joseph F. Guihan

(57) ABSTRACT

Electronic devices may be provided with conductive structures such as displays and conductive housing walls. Conductive gaskets may be used to form electrical paths between opposing conductive structures in an electronic device. The conductive gaskets may be formed from conductive sheets of material such as conductive fabric sheets. The conductive fabric or other conductive sheets may form conductive gasket wall structures that extend around air-filled cavities in the conductive gaskets. A conductive gasket may have an elongated shape such as a tubular shape that is characterized by a longitudinal axis. The longitudinal axis may follow a straight path or a curved path. To facilitate bending of a hollow conductive gasket to follow a curved path, the wall structures of the gasket may be provided with openings. Cables may be held in place using flaps of gasket wall material and may run through interior portions of a hollow gasket.

16 Claims, 25 Drawing Sheets

HOLLOW CONDUCTIVE GASKETS WITH CURVES AND OPENINGS

BACKGROUND

This relates generally to electronic devices and, more particularly, to conductive gaskets.

Conductive gaskets are used in electronic devices to short conductive structures together. For example, a conductive component such as a portion of a display or antenna may be electrically coupled to a conductive member by compressing a conductive gasket between the component and conductive member. This may short the conductive component to the conductive member, thereby grounding the conductive component and reducing interference in the electronic device.

Conductive gaskets are typically formed from foam that is wrapped in a conductive fabric. During assembly, the foam is compressed between the structures that are being shorted together. The foam attempts to return to its original uncompressed shape, thereby biasing the conductive fabric against the conductive structures.

It can be challenging to use foam gaskets. The biasing forces produced by compressed foam may tend to disassemble parts and may create undesired stresses. To ensure adequate mechanical tolerances, it may be necessary to use generously sized foam thicknesses. Overcoming the strong biasing forces that may result from the use of thick foam can be difficult and can force a designer to make undesired compromises when constructing an electronic device. The use of solid gaskets such as fabric covered foam gaskets may also reduce the amount of space available for other components in an electronic device.

It would therefore be desirable to be able to provide improved conductive gaskets for use in electronic devices.

SUMMARY

Electronic devices may be provided with conductive structures such as displays and conductive housing walls. Conductive gaskets may be used to form electrical paths between opposing conductive structures in an electronic device. During device assembly, a conductive gasket may be compressed between opposing conductive structures. The compressed conductive gasket may press outwards against the conductive structures, thereby forming an electrical pathway between the conductive structures.

A conductive gasket may be formed from a conductive gasket wall structure. The conductive gasket wall structure may surround and at least partly enclose an air-filled cavity.

Conductive gasket wall structures may be formed from conductive fabric, metal coated on dielectric sheets, or other conductive wall structures. Conductive fabric may be formed from metal fibers, dielectric fibers coated with metal, combinations of conductive fibers and fibers that are not conductive, or other suitable fibers.

A conductive gasket may have an elongated shape such as a tubular shape that is characterized by a longitudinal axis. The longitudinal axis may follow a straight path or a curved path. To facilitate bending of a hollow conductive gasket to follow a curved path, the wall structures of the gasket may be provided with openings. Openings may also be formed to create air passageways and passageways for cables. If desired, cables may be routed along the interior of a hollow gasket. Cables that run parallel to a gasket may be held in place along the exterior of the gasket using flaps of gasket wall material.

Sheet metal clips and other engagement structures may be attached to a conductive gasket using adhesive. In a curved gasket, a strip of curved material may be attached along the wall of the gasket using adhesive.

Further features of the invention, its nature and various advantages will be more apparent from the accompanying drawings and the following detailed description of the preferred embodiments.

DETAILED DESCRIPTION

Electronic devices may be provided with antennas and other wireless communications circuitry. The wireless communications circuitry may be used to support wireless communications in wireless communications bands such as wireless local area network bands, cellular telephone bands, satellite navigation system bands, and other communications bands. Electronic device may also contain electronic components such as displays. When operating an electronic device, it is often desirable to short together conductive structures. For example, it may be desirable to ground a portion of a display or a portion of an antenna to a conductive housing structure. By shorting together the conductive structures, electromagnetic interference (EMI) within an electronic device may be reduced. Conductive structures may also be shorted together to reduce the likelihood of component damage during electrostatic discharge events and to ensure proper grounding for other device functions.

The conductive structures that are being shorted together in an electronic device are often separated by an air gap. A conductive gasket structure may be interposed between opposing conductive structures to form a shorting path. The conductive gasket structure may be configured to span the air gap between the opposing conductive structures when the conductive structures and gasket structures are assembled together into an electronic device.

A conductive gasket structure may be compressed between opposing conductive structures during device assembly. Excessive restoring force from the compressed gasket structure may be avoided by using hollow gasket arrangements and/or gasket configurations that include relatively weak internal biasing structures. Examples of weak internal biasing approaches include the use of hollow gaskets, the use of gaskets that are partially hollow, the use of gaskets that are only partly filled with foam, the use of gaskets filled with plastic wool, the use of corrugated internal biasing structures, and the use of other biasing structures that contain relatively large amounts of air so that the interior cavity regions within the gaskets are at least partly air filled.

Figure 1:
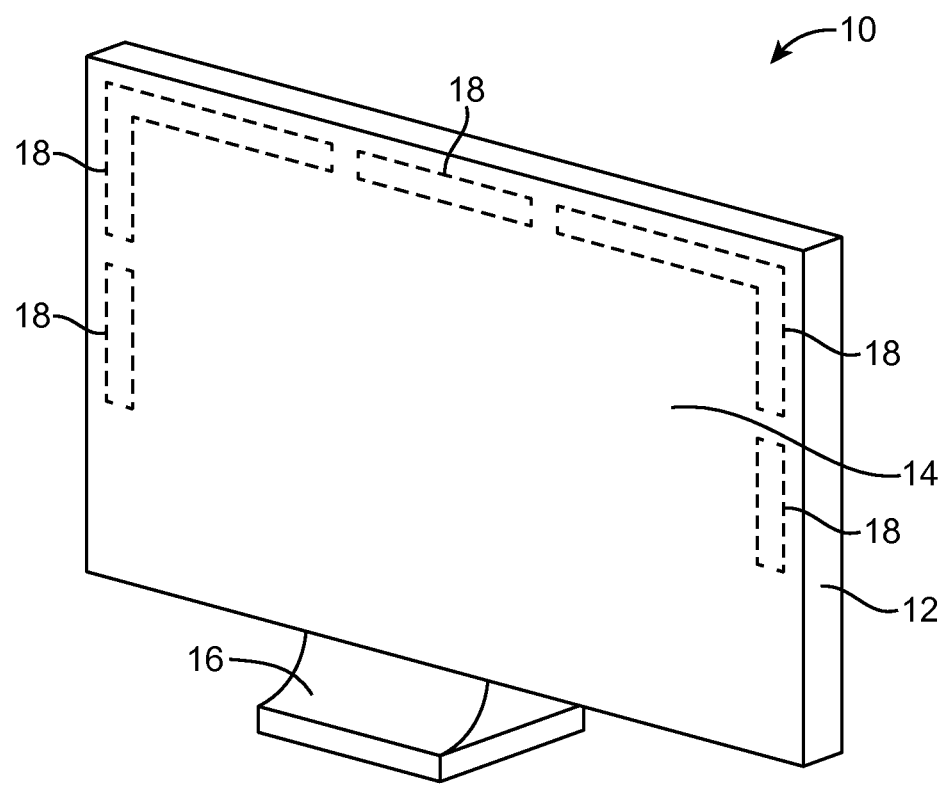
FIG. 1 is a perspective view of an illustrative electronic device with conductive gasket structures in accordance with an embodiment of the present invention.

An illustrative electronic device of the type that may be provided with one or more conductive gaskets is shown in FIG. 1. Electronic device 10 may be a computer such as a computer that is integrated into a display such as a computer monitor. Electronic device 10 may also be a laptop computer, a tablet computer, a somewhat smaller portable device such as a wrist-watch device, pendant device, headphone device, earpiece device, or other wearable or miniature device, a cellular telephone, a media player, or other electronic equipment. Illustrative configurations in which electronic device 10 is a computer formed from a computer monitor are sometimes described herein as an example. In general, electronic device 10 may be any suitable electronic equipment.

Conductive gaskets may be formed in device 10 in any suitable location such as locations 18. Locations 18 may include, for example, edge locations that run parallel to the four edges of device 10 and corner locations at the upper or lower corners of device 10 (as examples). Device 10 may include conductive structures that are electrically shorted together using conductive gaskets. The conductive structures may include conductive housing structures, conductive structures such as metal traces on dielectric carriers, conductive structures that are parts of display modules (e.g., metal chassis structures), metal traces in flexible printed circuits and rigid printed circuits, metal foil supported by dielectric carrier structures, wires, cables, and other conductive materials.

Device 10 may include a display such as display 14. Display 14 may be mounted in a housing such as electronic device housing 12. Housing 12 may be supported using a stand such as stand 16 or other support structure.

Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Display 14 may be a touch screen that incorporates capacitive touch electrodes or other touch sensor components or may be a display that is not touch sensitive.

Figure 2:
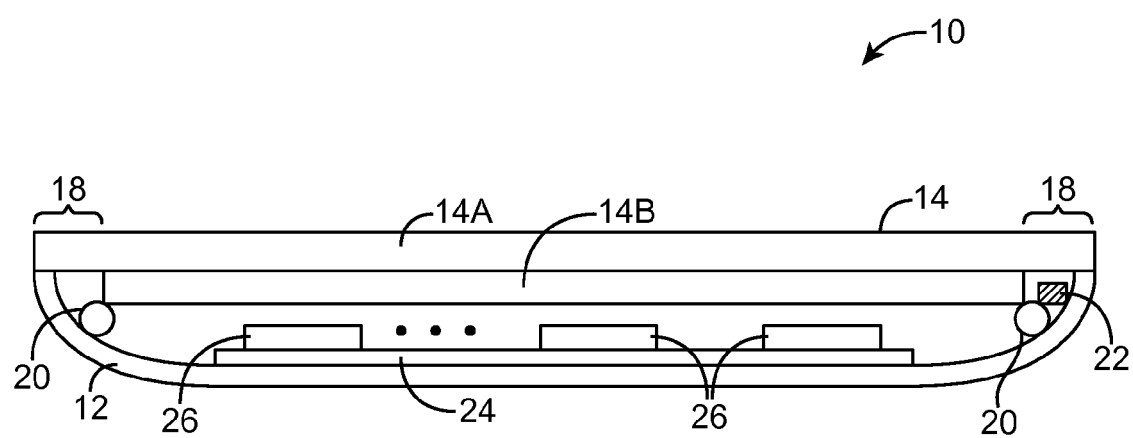
FIG. 2 is a cross-sectional side view of illustrative conductive gaskets within an illustrative electronic device in accordance with an embodiment of the present invention.

A cross-sectional side view of device 10 is shown in FIG. 2. As shown in FIG. 2, display 14 may include a transparent display cover layer such as display cover layer 14A. Display cover layer 14A may be formed from a clear glass layer, a transparent layer of plastic, or other transparent material. Display 14 may include display structures 14B. Display structures 14B may include an array of display pixels for displaying images for a user. Display cover layer 14A may be used to protect display structures 14B and, if desired, touch sensor structures in display 14. Display structures 14B may include display pixels formed from light-emitting diodes (LEDs), organic LEDs (OLEDs), plasma cells, electrophoretic display structures, electrowetting display structures, liquid crystal display (LCD) components, or other suitable display pixel structures.

As shown in the example of FIG. 2, conductive gaskets such as conductive gaskets 20 may be used to electrically connect opposing conductive structures in device 10. In the FIG. 2 configuration, gaskets 20 are being used to electrically connect display structures 14B to housing 12. Display structures 14B may include conductive structures such as a metal chassis member that surrounds and encloses the lower portion of display structures 14B. Housing 12 may include metal walls. Gaskets 20 in regions 18 may be used in shorting the metal chassis member of display 14 or other conductive component structures to conductive housing 12 or may otherwise be used in shorting together conductive structures in device 10. If desired, gaskets 20 may be used to short an antenna ground (e.g., an antenna cavity wall) in antennas such as antenna 22 to opposing conductive structures such as display structures 14B and/or conductive housing 12.

By forming conductive interfaces that fill gaps between opposing conductive structures such as display structures 14B and housing 12 and by otherwise grounding conductive structures within device 10, potential pathways for electromagnetic interference within device 10 may be reduced or eliminated. For example, by forming a conductive seal between display structures 14B and housing 12, potential pathways for electromagnetic interference between components 26 on printed circuit 24 and components such as antenna 22 may be blocked. Components 26 may include display driver circuitry, processors, memory, communications circuitry such as wireless transceiver circuitry, and application-specific integrated circuits. By blocking the air gap between components 14B and housing 12, a reduced number of interfering signals may pass between antenna 22 and components 26, thereby improving wireless performance in device 10. In general, conductive gaskets such as conductive gaskets 20 of FIG. 2 may be used to short together any two or more conductive structures in device 10. The illustrative configuration of FIG. 2 is merely an example.

Figure 3:
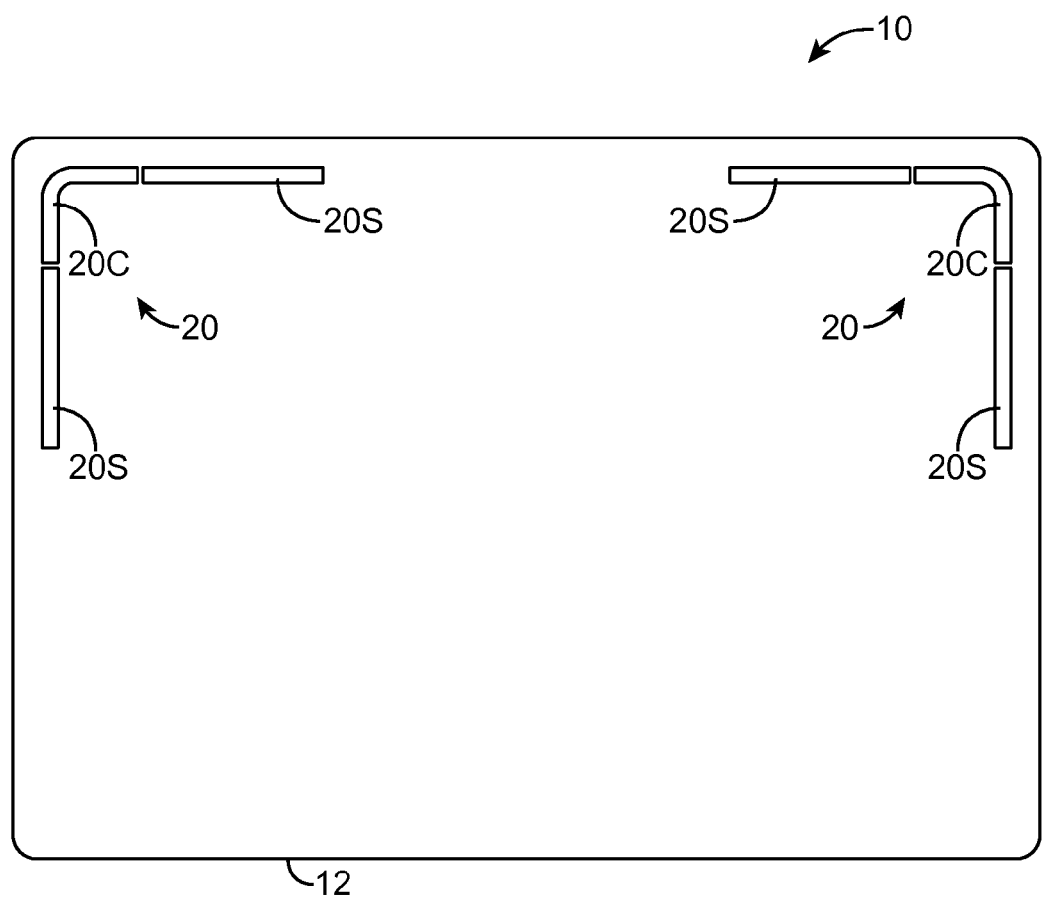
FIG. 3 is a top view of an illustrative electronic device with curved and straight elongated conductive gaskets in accordance with an embodiment of the present invention.

FIG. 3 is a top view showing how conductive gaskets 20 may have elongated shapes that are straight (e.g., straight gaskets 20S) and curved (e.g., curved gaskets 20C). In the illustrative configuration of FIG. 3, gaskets 20 have been placed so that they run parallel to the straight edges and curved corners of housing 12. If desired, gaskets 20 may be placed within other locations in device 10. The configuration of FIG. 3 is merely illustrative.

Figure 4:
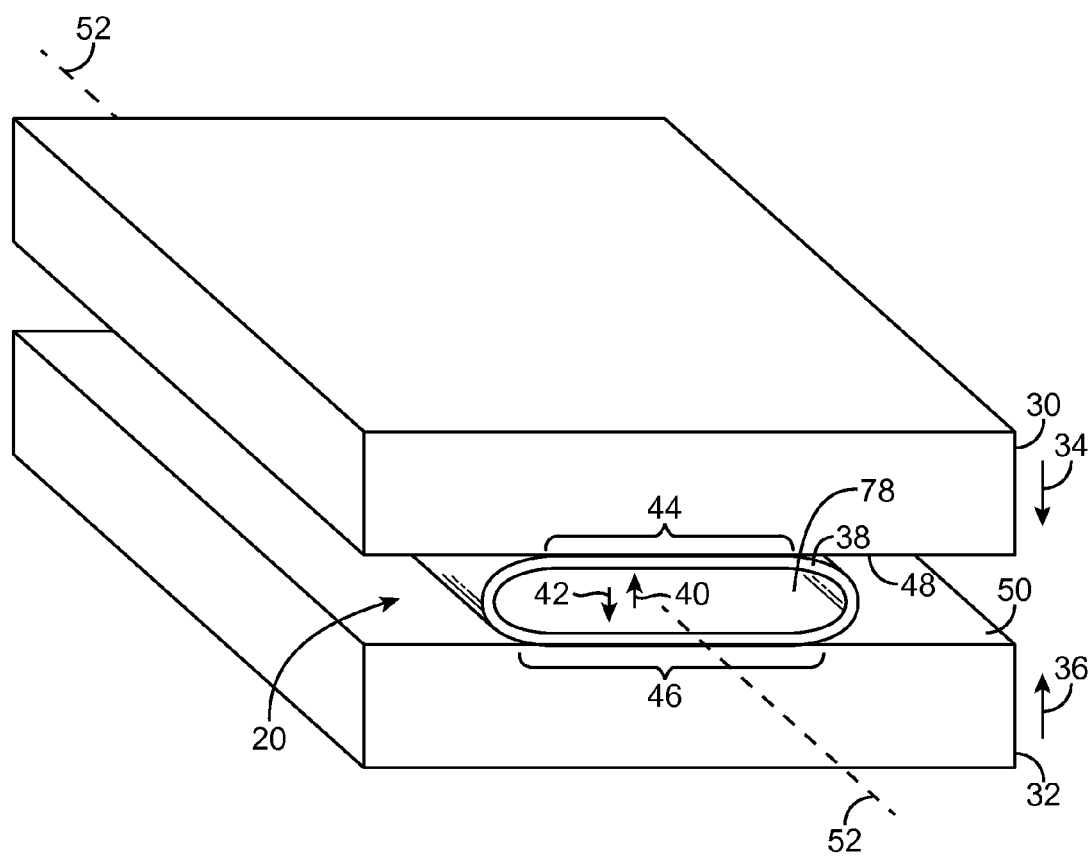
FIG. 4 is a perspective view of an illustrative tube-shaped conductive gasket compressed between two opposing conductive structures in accordance with an embodiment of the present invention.

Gaskets 20 may have a hollow tube shape or other configuration that is compressible, but that does not exert excessive restoring forces upon structures in device 10 following assembly. An illustrative arrangement in which a hollow tube-shaped conductive gasket has been compressed between two opposing conductive structures is shown in FIG. 4. As shown in FIG. 4, gasket 20 may be hollow (i.e., gasket 20 may have a gasket wall such as wall 38 that extends around air-filled cavity 78, so that the interior of gasket 20 is filled only with air. If desired, some of the interior of gasket 20 may be provided with internal support structures (e.g., structures formed from foam biasing layers, foam structures with undulating surfaces, corrugated sheets of biasing material, or other structures that support cavity wall 38).

Conductive device structures such as structures 30 and 32 of FIG. 4 may be moved towards each other during device assembly operations. As structure 30 is moved downwards in direction 34 towards structure 32 and/or as structure 32 is moved upwards in direction 36 towards structure 30, conductive gasket 20 may be compressed between structures 30 and 32. When compressed, gasket wall 38 may press outwards against conductive structures 30 and 32, thereby forming an electrical pathway between structures 30 and 32. For example, the upper portion of gasket wall 38 may press upwards in direction 40 against lower surface 48 of structure 30 in region 44 and the lower portion of gasket wall 38 may press downwards in direction 42 against upper surface 50 of structure 32. Relatively large contact patches (i.e., the areas in regions 44 and 46) may be used in forming connections to structures 30 and 32, thereby minimizing contact resistance.

Gaskets such as gasket 20 may have any suitable shape. In the example of FIG. 4, gasket 20 has an elongated hollow tube shape that extends along longitudinal axis 52. If desired, conductive gaskets such as gasket 20 may be formed with other shapes (e.g., circular outlines, rectangular outlines, square outlines) and may have other cross-sectional shapes. Gaskets 20 may have shapes that accommodate internal biasing structures while leaving room for air-filled cavities within the interior of gasket 20, may have shapes that are completely hollow at one location along their length but that are not completely hollow at another location along their length, etc. The elongated tubular shape of conductive gasket 20 of FIG. 4 is merely illustrative.

Figure 5:
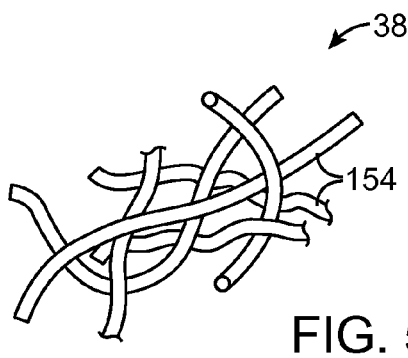
FIG. 5 is a diagram of illustrative fibers in a conductive fabric gasket in accordance with an embodiment of the present invention.

Conductive material for gasket wall 38 may be formed from a sheet of metal, a metal coating on a sheet of dielectric, metal fibers, metal-coated fibers, or other suitable conductive material. As shown in FIG. 5, conductive gasket 20 (e.g., gasket wall 38) may be formed from fibers such as fibers 154 (e.g., gasket wall structure 38 may be formed from a layer of conductive fabric). Fibers 154 may include metal fibers, plastic fibers coated with metal, glass fibers, carbon fibers, organic fibers, inorganic fibers, fibers formed from other materials, and fibers formed from two or more of these materials. Fibers 154 may have circular cross-sectional shapes, oval cross-sectional shapes, rectangular cross-sectional shapes, square cross-sectional shapes, triangular cross-sectional shapes, and other cross-sectional shapes.

Figure 6:
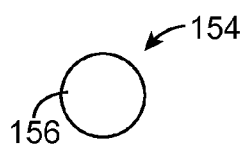
FIG. 6 is a cross-sectional view of a fiber such as a solid fiber in a conductive fabric gasket in accordance with an embodiment of the present invention.
Figure 7:
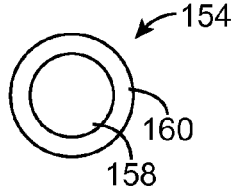
FIG. 7 is a cross-sectional view of a fiber coated with a conductive material such as metal in a conductive fabric gasket in accordance with an embodiment of the present invention.

As shown in FIG. 6, fibers 154 in gasket wall 38 may be formed from a solid material such as material 156. Material 156 may be, for example, a conductive material such as metal. As shown in FIG. 7, fibers 154 may include multiple materials such as inner material (core) 158 and outer material (coating) 160. Core 158 may be, for example, a dielectric such as glass, plastic, or ceramic, or may be a conductive material such as metal (as examples). Outer layer 160 may be formed from a conductive material such as metal (as an example). Layer 160 may be formed on each of fibers 154 before fibers 154 are used in forming conductive fabric or other fiber-based material for gasket wall 38 or may be deposited as a coating on fibers 154 after fibers 154 have been used to form conductive fabric or other fiber-based material for gasket wall 38 (e.g., after fibers 154 have been woven into a fabric layer).

Figure 8:
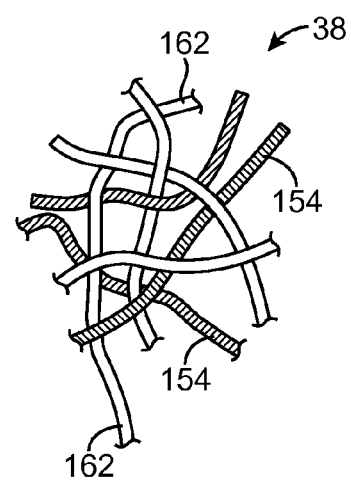
FIG. 8 is a diagram of a conductive fabric having conductive fibers and other fibers in accordance with an embodiment of the present invention.

As shown in FIG. 8, gasket wall 38 (e.g., a fabric sheet for forming wall 38) may include multiple fibers such as fibers 154 and fibers 162. Fibers 154 may include conductive fibers such as solid metal fibers and/or dielectric fibers coated with metal or other conductive fibers. Fibers 162 may be formed from plastic, glass, or other non-conductive material. For example, fibers 162 may be formed from solid dielectric material with a circular cross-sectional shape such as material 156 in FIG. 6. If desired, fabric gasket wall structures such as structures 38 of FIG. 8 may be formed from three or more different types of fibers (e.g., conductive fibers and/or dielectric fibers). The example of FIG. 8 in which structures 38 include two types of fiber is merely illustrative.

Figure 9:
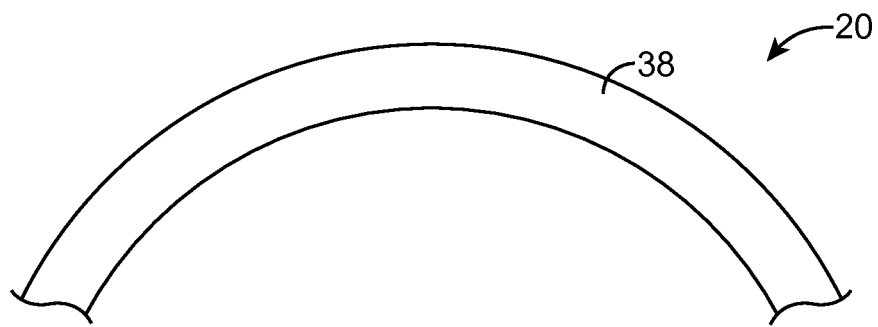
FIG. 9 is a cross-sectional view of a portion of a hollow gasket structure in which a gasket wall is formed from a single layer of material such as a layer of conductive foil or conductive fiber in accordance with an embodiment of the present invention.

FIG. 9 is a cross-sectional view of a portion of conductive gasket structure 20 in which gasket wall 38 has been formed from a single layer of material. Gasket wall 38 may, for example, be formed from a woven conductive fabric with solid conductive fibers and/or fibers with two or more layers of material such as an inner core covered with an outer conductive layer of metal or may be formed from a sheet of flexible metal (e.g., metal foil).

Figure 10:
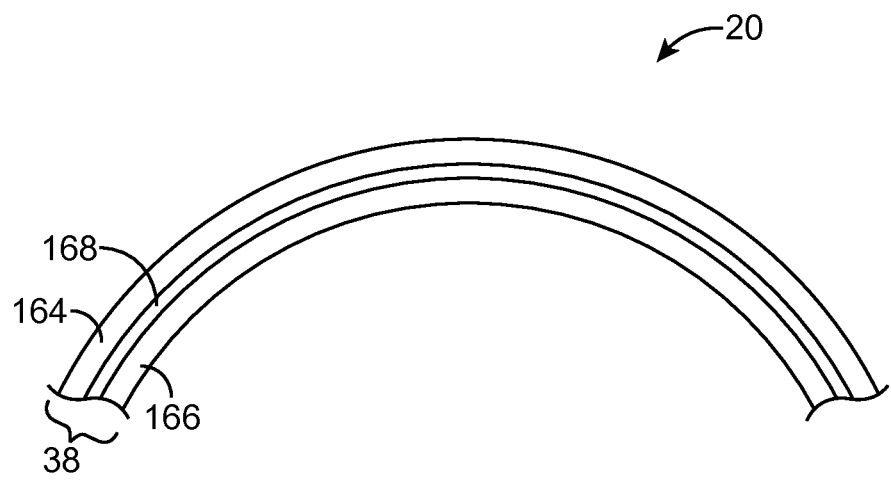
FIG. 10 is a cross-sectional view of a portion of a hollow gasket structure in which a gasket wall is formed from a conductive outer layer of material such as a layer of conductive foil or conductive fiber and an inner support layer such as a layer of plastic or foam that lines the inner surface of the conductive outer layer in accordance with an embodiment of the present invention.

FIG. 10 is a cross-sectional view of a portion of conductive gasket structure 20 in which gasket wall 38 has been formed from a conductive outer layer of material (layer 164) and one or more inner layers of material such as layer 166. Outer layer 164 may be, for example, a conductive fabric such as a fabric formed from solid conductive fibers and/or fibers with two or more layers of material such as an inner core covered with an outer conductive layer of metal. If desired, some or all of outer layer 164 may be formed from a sheet of flexible metal (e.g., metal foil).

Outer layer 164 of conductive gasket structure 20 may be attached to one or more inner layers such as layer 166. For example, outer layer 164 may be attached to inner layer 66 using adhesive layer 168. Adhesive layer 168 may be formed from a pressure sensitive adhesive material, a conductive adhesive material, or other suitable adhesive. Inner layer 166 may line the interior surface of layer 164 and may provide layer 164 with additional strength and resiliency. Inner layer 166 may be formed from a flexible layer of metal, a flexible layer of fabric, a flexible layer of plastic, a flexible layer of foam, a flexible layer of one or more other materials, or a flexible layer formed from two or more such layers. If desired, additional layers may be stacked below layer 166 (e.g., layer 166 may be lined with one or more additional layers of fabric, one or more additional layers of plastic, one or more additional layers of foam, etc.).

Figure 11:
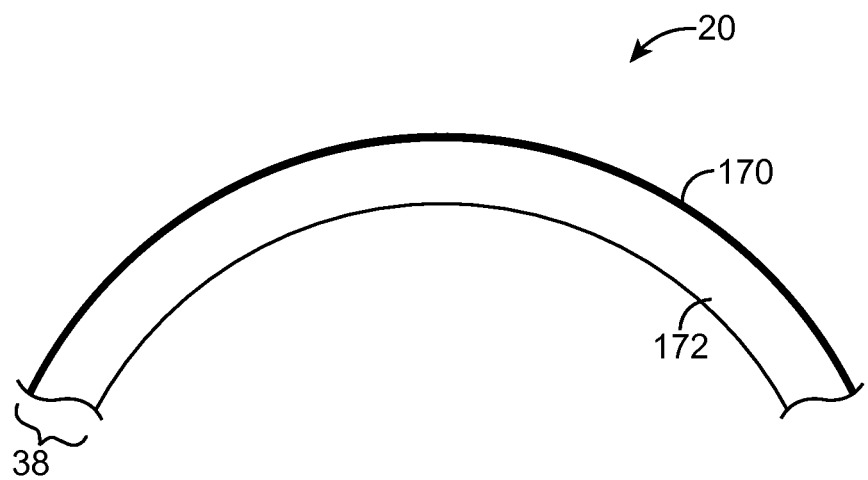
FIG. 11 is a cross-sectional view of a portion of a hollow gasket structure in which a gasket wall is formed from a conductive outer layer of material such as a metal coating on an inner layer such as a dielectric layer formed from plastic in accordance with an embodiment of the present invention.

As shown in the cross-sectional view of FIG. 11, wall 38 of conductive gasket structure 20 may have a conductive coating such as coating 170 that is formed on the outer surface of a flexible support layer such as layer 172. Coating 170 may be, for example, a layer of metal or other conductive material.

Layer 172 may be formed from fabric, a layer of plastic, a layer of metal, or a layer formed from one or more other dielectric and/or conductive materials. Coating 170 may be formed on the outer surface of sheet 172 using physical vapor deposition, using chemical vapor deposition, by spraying, by electrochemical deposition (e.g., by electroplating), or by using other suitable deposition techniques.

Figure 12:
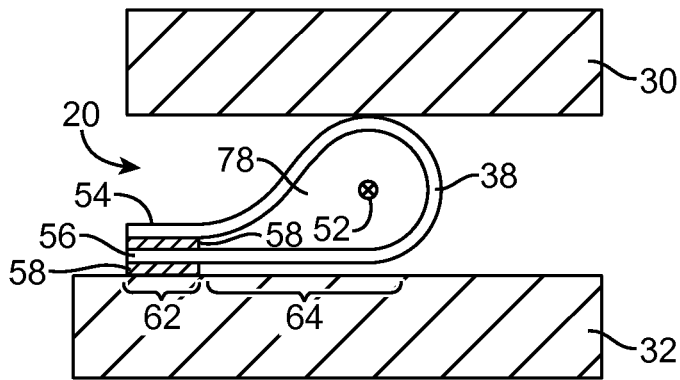
FIG. 12 is a cross-sectional view of a conductive gasket having a P-shaped cross section in accordance with an embodiment of the present invention.

FIG. 12 is a cross-sectional view of an illustrative hollow conductive gasket having a P-shaped cross section. As shown in FIG. 12, gasket 20 may be compressed between opposing conductive structures such as conductive structures 30 and 32. Conductive gasket wall 38 may extend around longitudinal axis 52. Gasket 20 may have a main portion such as portion 64 in which gasket wall 38 surrounds air-filled cavity 78 (e.g., an elongated air-filled cavity that extends along the length of gasket 20). Gasket 20 may also have a tail portion such as tail portion 62. Gasket wall 38 may have opposing edges such as edges 54 and 56. In tail region 62, edges 54 and 56 may be attached to conductive structure 32 using adhesive 58.

Gasket wall 38 may have an inner surface and an opposing outer surface. In region 62, the inner surface of a portion of gasket wall 38 at edge 54 may face the inner surface of a portion of gasket wall 38 at edge 56. The outer surface of gasket wall 38 may be attached to the surface of conductive structure 32 using adhesive 58. During assembly operations, a tool (e.g., a heated member or other suitable member) may be used to press downwards on the layers of gasket wall 38 in region 62, thereby causing adhesive 58 to attach gasket wall 38 and gasket 20 to conductive structure 32. Other types of assembly techniques may be used to form gasket 20 and to attach gasket 20 to conductive structures in device 10, if desired. The configuration of FIG. 12 is merely illustrative.

Figure 13:
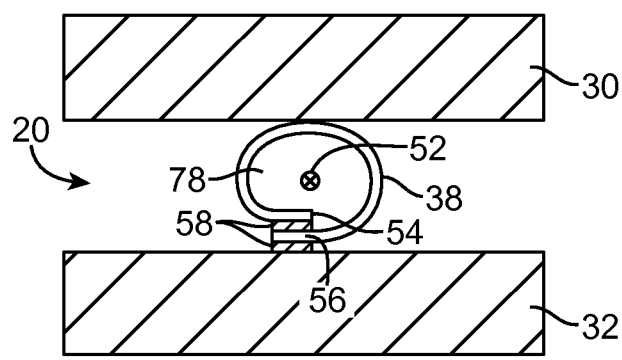
FIG. 13 is a cross-sectional view of a conductive gasket having an O-shaped cross section in accordance with an embodiment of the present invention.

FIG. 13 is a cross-sectional view of gasket 20 in a configuration in which gasket wall 38 has been wrapped around longitudinal axis 52 to form an O-shaped cross section for gasket 20. Adhesive 58 may be used to attach edges 54 and 56 of gasket wall 38 to conductive structures 38 in a configuration in which the outer surface of edge 54 is attached to the inner surface of edge 56 and in which the outer surface of edge 56 is attached to structures 32. If desired, other types of seams may be formed to create a gasket with an O-shaped cross-section (e.g., joints with abutting edges that do not overlap). The configuration of FIG. 13 is provided as an example.

Figure 14:
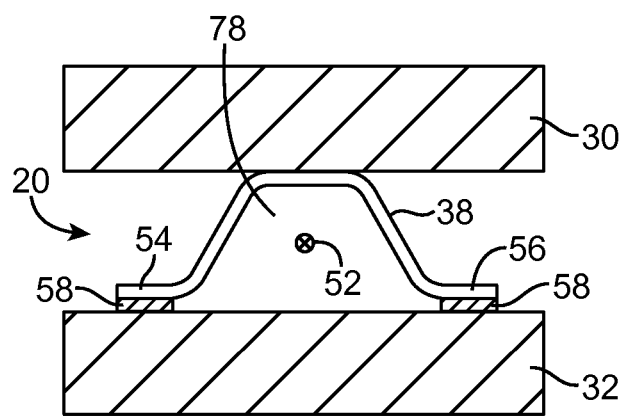
FIG. 14 is a cross-sectional view of a portion of a conductive gasket having a C-shaped cross section in accordance with an embodiment of the present invention.

In the illustrative arrangement of FIG. 14, conductive gasket wall 38 has been configured to form a C-shaped gasket cross section. Gasket wall 38 has a portion that extends around longitudinal axis 52 and forms an upper boundary for air-filled cavity 78. A lower boundary for air-filled cavity 78 may be formed by part of conductive structure 32 or other materials (e.g., a separate sheet of gasket wall material, conductive tape, a strip of metalized plastic etc.). Gasket wall 38 may have a left-hand edge such as edge 54 that has an inner surface attached to conductive structure 32 using adhesive 58. Gasket wall 38 may also have a right-hand edge such as edge 56 that has an inner surface attached to conductive structure 32 using adhesive 58.

When forming gaskets such as straight elongated hollow conductive gaskets 20S of FIG. 3, gasket wall 38 may form a straight hollow cylinder with a P-shaped cross section, an O-shaped cross section, a C-shaped cross section, or a cross section with other suitable shapes. Curved gaskets such as curved hollow conductive gaskets 20C of FIG. 3 may be formed by bending a hollow cylinder of gasket wall material. To help reduce or eliminate wrinkles in gasket wall material 38 in configurations in which a portion of gasket 20 follows a curved path, slits or other openings may be formed in the gasket at various locations along its length (e.g., at intervals along the curved portion of gasket 20).

Figure 15:
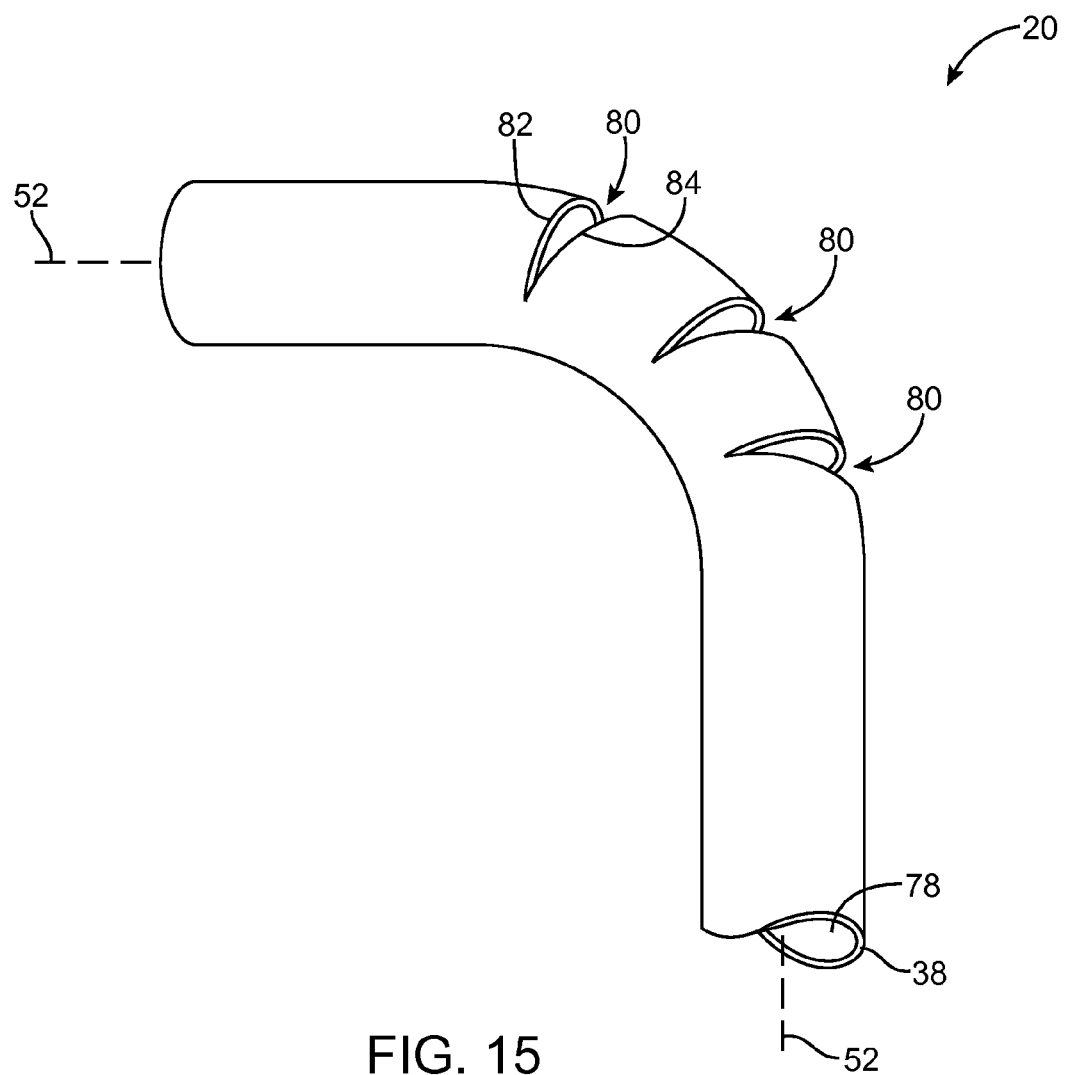
FIG. 15 is a perspective view of a curved hollow conductive gasket having openings to facilitate bending in accordance with an embodiment of the present invention.

An illustrative curved gasket with slits (i.e., a gasket that may serve as one of curved gaskets 20C of FIG. 3) is shown in FIG. 15. As shown in FIG. 15, curved gasket 20 may have an elongated shape that extends along curved longitudinal axis 52. Gasket wall 38 may be configured to have a P-shaped cross section as described in connection with FIG. 12 or may be configured to have other suitable cross-sectional shapes (e.g., an O-shaped cross section of the type shown in FIG. 13, a C-shaped cross section of the type shown in FIG. 14, etc.). To reduce wrinkling in gasket wall 38 as gasket 20 is bent into the curved shape of FIG. 15, gasket 20 may be provided with openings 80 at various locations along its length (i.e., at various positions along longitudinal axis 52).

Openings 80 may be formed by making straight cuts into gasket wall 38, so that edges 82 and 84 of each opening 80 part from each other to form an opening (i.e., a slit) without removing any of the material of gasket wall 38 or, if desired, material may be removed from gasket wall 38 to form openings 80.

Figure 16:
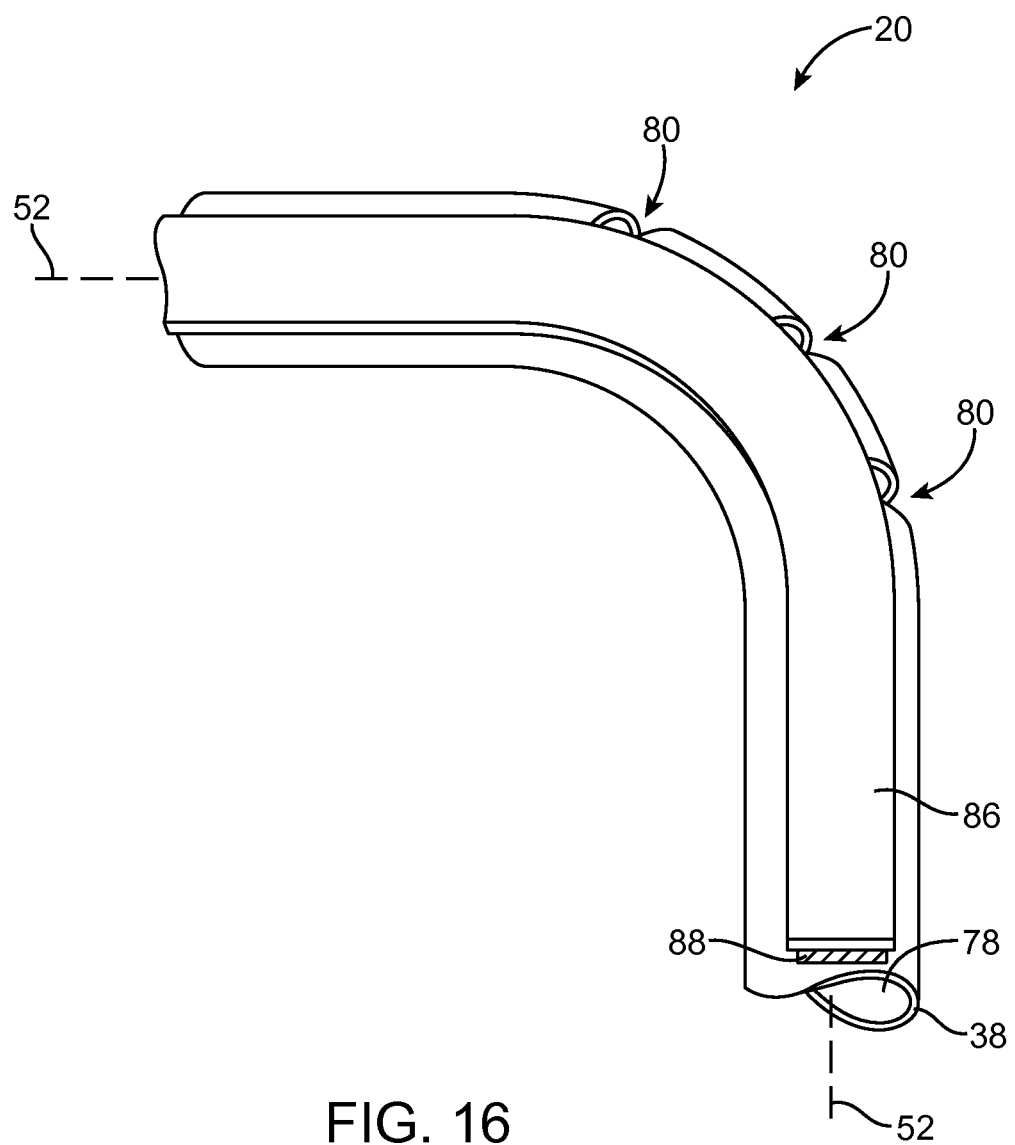
FIG. 16 is a perspective view of a curved hollow conductive gasket of the type shown in FIG. 15 having an upper surface that has been covered with a curved strip of material in accordance with an embodiment of the present invention.

If desired, portions of the exposed surface of gasket 20 such as the uppermost surface of gasket wall 38 may be covered with one or more layers of additional material. As shown in FIG. 16, for example, gasket 20 may be covered with a curved piece of material such as curved strip 86. Strip 86 may be formed from a cut sheet of plastic, a metal layer, a layer formed from one or more different materials, or other suitable material. Adhesive such as adhesive 88 may be used in attaching curved strip 86 (e.g., a curved plastic strip) to gasket wall 38. Adhesive 88 may be conductive adhesive to ensure formation of a satisfactory low resistance electrical path between conductive structures 30 and 32 when curved gasket 20 of FIG. 16 is installed within device 10. Straight strips of material 86 may be used to cover straight portions of gasket 20.

Figure 17:
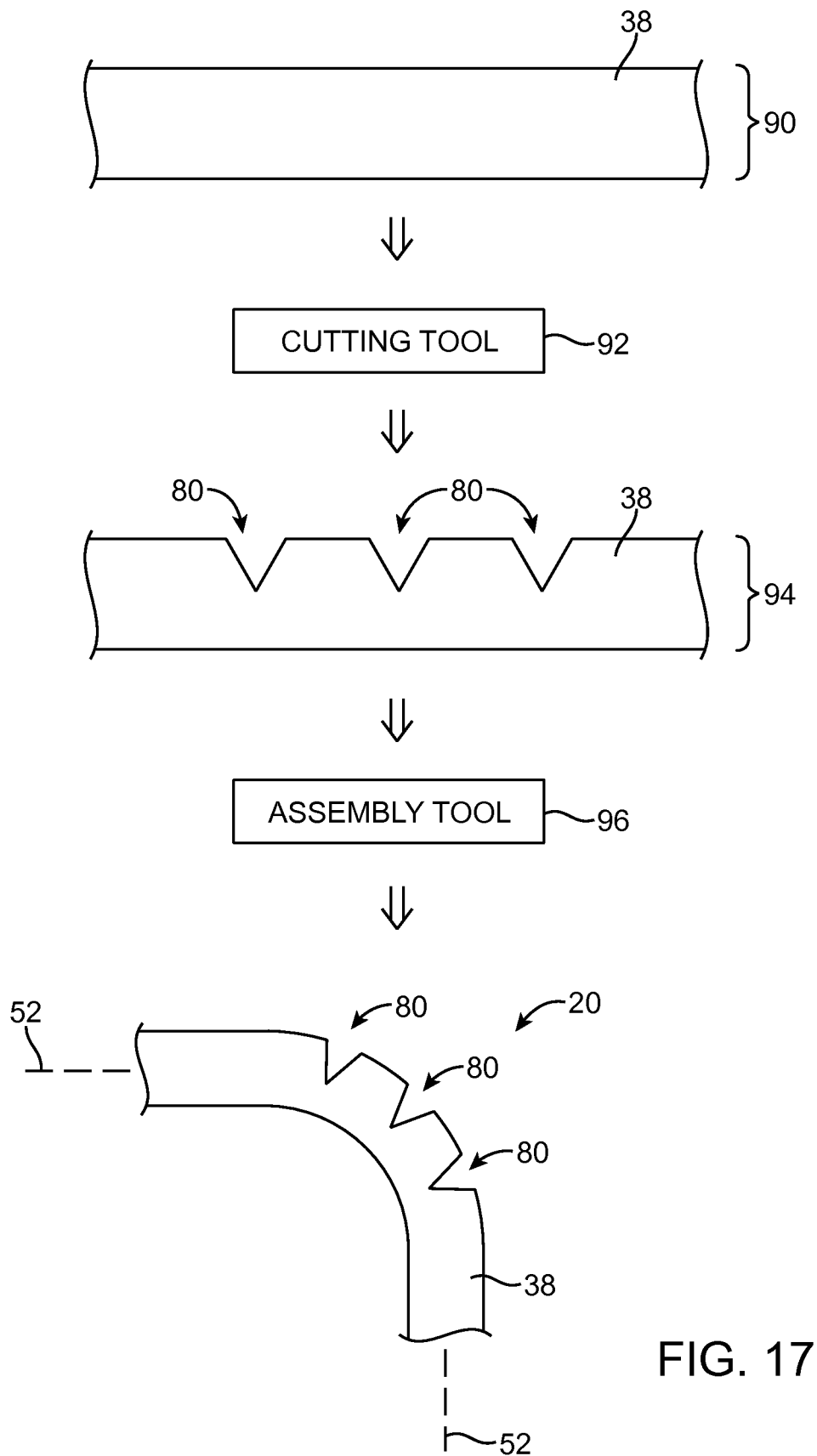
FIG. 17 is a diagram showing how openings may be formed along the length of a hollow conductive gasket to form a curved hollow conductive gasket in accordance with an embodiment of the present invention.

FIG. 17 is a diagram showing how openings may be formed along the length of a hollow conductive gasket to form a curved hollow conductive gasket. To facilitate bending, a cutting tool such as cutting tool 92 of FIG. 17 may be used to form openings in tube-shaped gasket structure (e.g., a hollow cylindrical tube of conductive gasket wall material such as gasket wall 38). Cutting tool 92 may include one or more cutting blades, laser cutting equipment, water-jet cutting equipment, or other equipment for forming cuts in the material of gasket wall 38. As shown in FIG. 17, the cuts that are made in the walls of tube 90 may be used to form a tube with openings 80 such as tube 94. Openings 80 may be formed by creating cuts with or without removing some of the material of gasket wall 38. For example, cutting tool 92 may be used to form straight cuts or cuts that remove pieces of gasket wall 38.

Following formation of openings 80 in tubular structure 94 of gasket wall material 38, assembly tools 96 may be used in forming curved gasket 20 and installing curved gasket 20 in device 10. Assembly tools 96 may, for example, include computer-controlled positioners and other equipment for bending tube 94 to form curved gasket 20, may include equipment for applying adhesive such as adhesive 58 of FIGS. 12, 13, and 14, and may otherwise be used in shaping tube 94 into curved gasket 20 of FIG. 17. As shown in FIG. 17, curved gasket 20 may have an elongated shape that is characterized by longitudinal axis 52. Openings 80 in curved gasket 20 may help gasket 20 form a curved shape within device 10 (e.g., so that gasket 20 may serve as one of curved gaskets 20C of FIG. 3 or may otherwise be used in coupling curved conductive structures) without wrinkling gasket wall 38.

Figure 18:
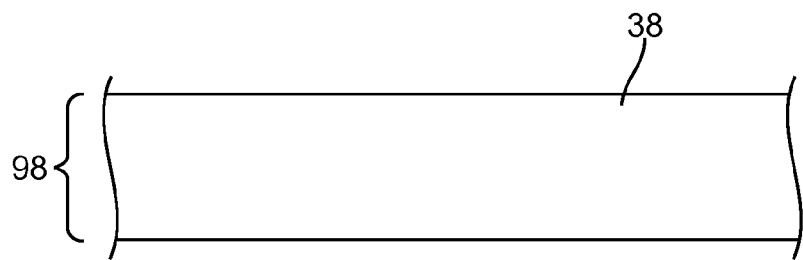
FIG. 18 is a top view of an illustrative hollow tube of conductive material that may be used in forming a conductive gasket in accordance with an embodiment of the present invention.
Figure 19:
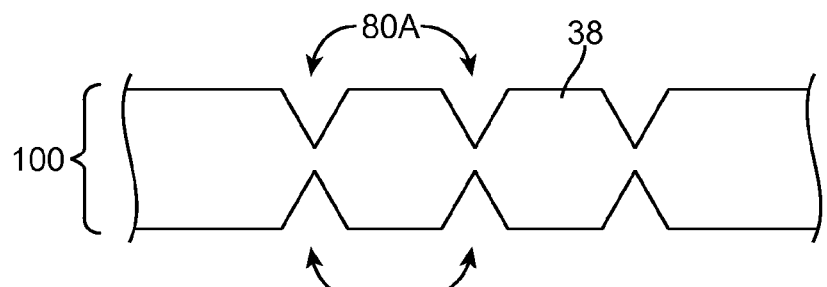
FIG. 19 is a top view of the hollow tube of FIG. 18 following formation of laterally opposed openings in the sides of the tube to promote bending in accordance with an embodiment of the present invention.
Figure 20:
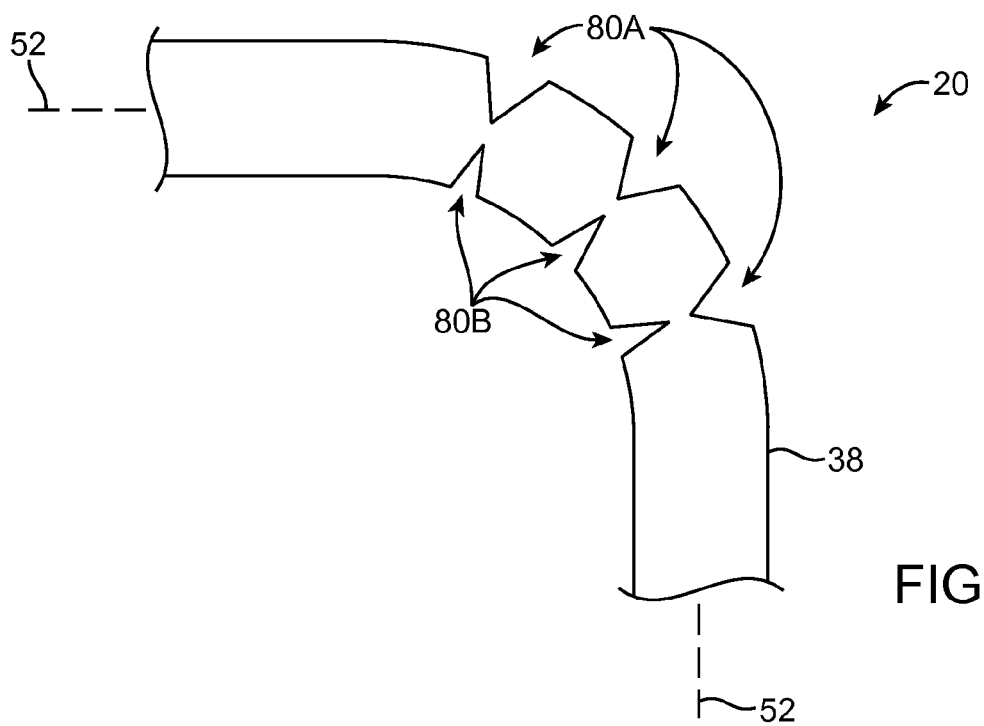
FIG. 20 is a top view of the hollow tube of FIG. 19 following bending of the tube to form a curved hollow conductive gasket in accordance with an embodiment of the present invention.

If desired, curved conductive gaskets may be provided with openings on opposing sides (i.e., in laterally opposing sidewall portions of gasket wall 38). Initially, gasket wall material 38 may be formed into a tubular shape such as tubular shape 98 of FIG. 18. A cutting tool such as cutting tool 92 of FIG. 17 may be used to cut openings in laterally opposing sides of tube 98, as shown by openings 80A and 80B in tubular gasket structure 100 of FIG. 19. Openings 80A may be formed along one side of gasket wall material 38 and laterally opposing openings 80B may be formed on an opposing side of gasket wall material 38. Following formation of tubular structure 100 by forming openings 80A and 80B in gasket wall 38, an assembly tool such as assembly tool 96 of FIG. 17 may be used to bend tubular structure 100 to form curved gasket 20 of FIG. 20. As shown in FIG. 20, openings 80A may be located along the outer edge of curved gasket 20 and may help allow gasket wall material 38 to expand to accommodate the relatively longer length of the outer edge of gasket 20 without stretching gasket wall material 38. Openings 80B may be located along the opposing (inner) edge of curved gasket 20 and may help accommodate the curvature of gasket 20 (i.e., the relatively shorter length of the inner edge of gasket 20) without compressing to form wrinkles in gasket wall structure 38.

Figure 21:
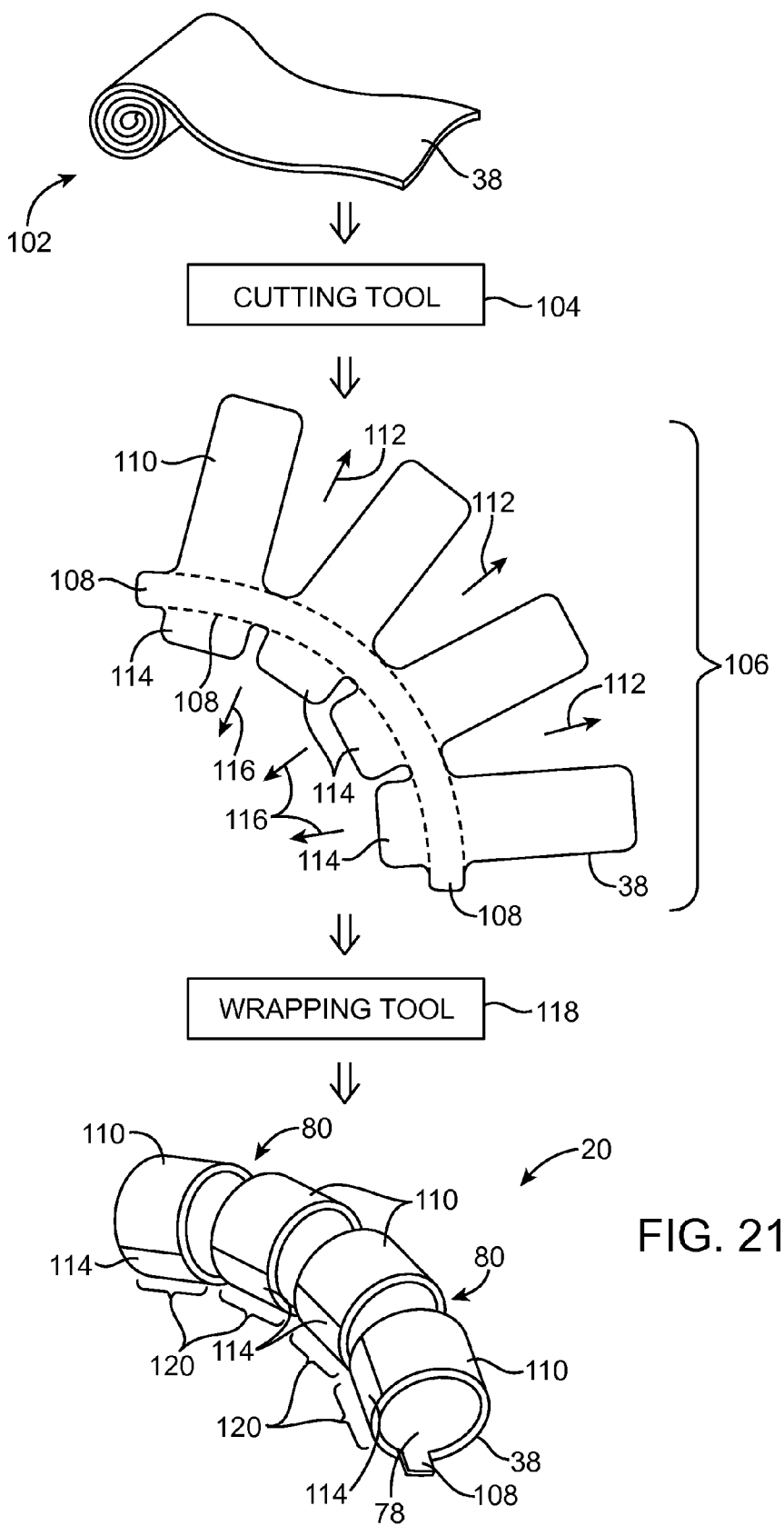
FIG. 21 is a diagram showing how a sheet of conductive gasket wall material may be formed into a segmented curved gasket with a hollow tube shape in accordance with an embodiment of the present invention.

FIG. 21 is a diagram showing how a sheet of conductive gasket wall material may be formed into a segmented curved gasket with a hollow tube shape. Initially, a roll of gasket wall material 38 may be obtained such as roll 102. A cutting tool such as cutting tool 104 may be used to cut gasket wall material 38 into a pattern suitable for forming a segmented curved gasket. As shown in FIG. 21, for example, cutting tool 104 may be used to cut a sheet of gasket wall material 38 to form patterned gasket wall material 106.

Patterned gasket wall material 106 may have a pattern with a curved spine such as spine 108. Spine portion 108 of patterned gasket wall material 106 may have a curved shape that matches the desired curvature for a finished curved gasket. Integral laterally protruding portions such as flap structures 110 may protrude outwardly from spine region 108 in directions 112. Laterally protruding flaps such as flap structures in regions 114 may protrude inwardly from spine 108 in directions 116. Cutting tool 104 may include die stamping equipment, one or more cutting blades, laser-cutting equipment, water-jet cutting equipment, or other equipment for cutting gasket wall sheet 38 to form patterned gasket wall sheet 106.

Following formation of patterned gasket wall material 106 with tool 104, an assembly tool such as wrapping tool 118 may be used to wrap flaps 110 and 114 into cylindrical gasket segments 120. Tool 118 may include computer-controlled actuators, equipment for dispensing adhesive, and other equipment for wrapping portions of structure 106 and for using adhesive to attach opposing portions of structure 106 to each other. Tool 118 may, for example, use adhesive to attach the tips of each flap 110 to the tip of a respective adjacent one of flaps 114. Curling flaps 110 and 114 onto each other and attaching the tips of the flaps to each other in this way may create a segmented curved conductive hollow gasket such as gasket 20 of FIG. 21. As shown in FIG. 21, gasket 20 may include multiple segments 120, each segment being formed by one of flaps 114 and one of flaps 110. Segments 120 are separated from each other by openings 80 and may be held together by integral spine portion 108. Because spine 108 has a curved shape, gasket wall 38 (i.e., patterned material 106) may be wrapped to form curved gasket 20 of FIG. 21 without introducing excessive wrinkles into gasket wall 38.

Electronic device 10 may contain electrical cables such as radio-frequency transmission lines (e.g., coaxial cables, transmission lines formed on flexible printed circuit substrates, etc.), signals buses (e.g., wires for forming analog signal paths, wires for forming digital signal paths), wires for conveying power supply signals in device 10, and other conductive paths. Cables may be formed from solid strands of metal covered with insulating coating, from wire that includes multiple wire filaments, from conductive traces on a flexible printed circuit or rigid printed circuit substrate, or from other conductive structures.

Figure 22:
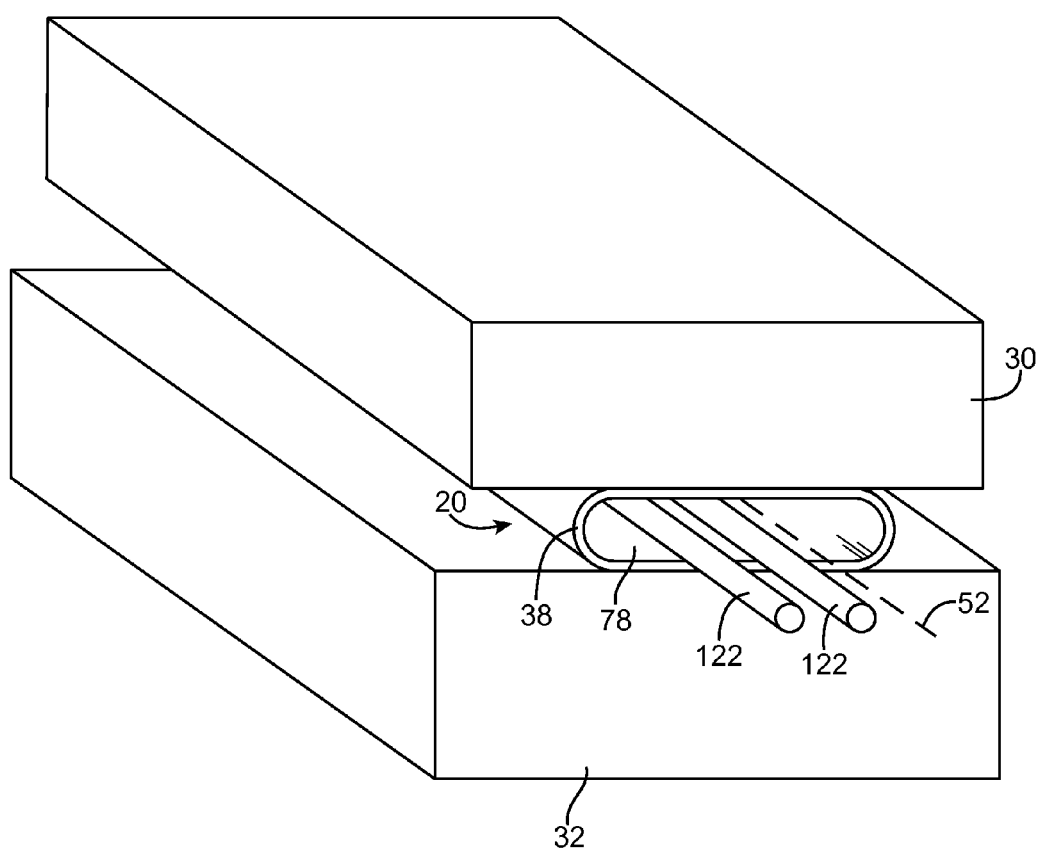
FIG. 22 is a perspective view of an illustrative hollow gasket though which cables have been routed in accordance with an embodiment of the present invention.

Space is often at a premium in electronic devices. To conserve space and reduce clutter in device 10, cables can be routed through interior portions of hollow gaskets. FIG. 22 is a perspective view of an illustrative configuration for hollow conductive gasket 20 showing how cables 122 may be routed through interior cavity region 78 within gasket wall 38 of gasket 20. Cables 122 may be transmission lines, analog signal lines, digital signal lines, power supply lines, or other signal paths in device 10. There are two cables 122 in the illustrative configuration of FIG. 22 each of which runs parallel to longitudinal axis 52 of elongated conductive hollow gasket 20. This is merely illustrative. In general, one of cables 122, two of cables 122, three or more of cables 122, or any other suitable number of cables may be routed through air-filled cavity 78 of gasket 20. Gasket 20 may have a straight shape or may be curved (e.g., by providing gasket 20 with openings 80). Cables 122 may enter and exit gasket 20 through the ends of gasket 20 or through side openings in gasket wall 38.

Figure 23:
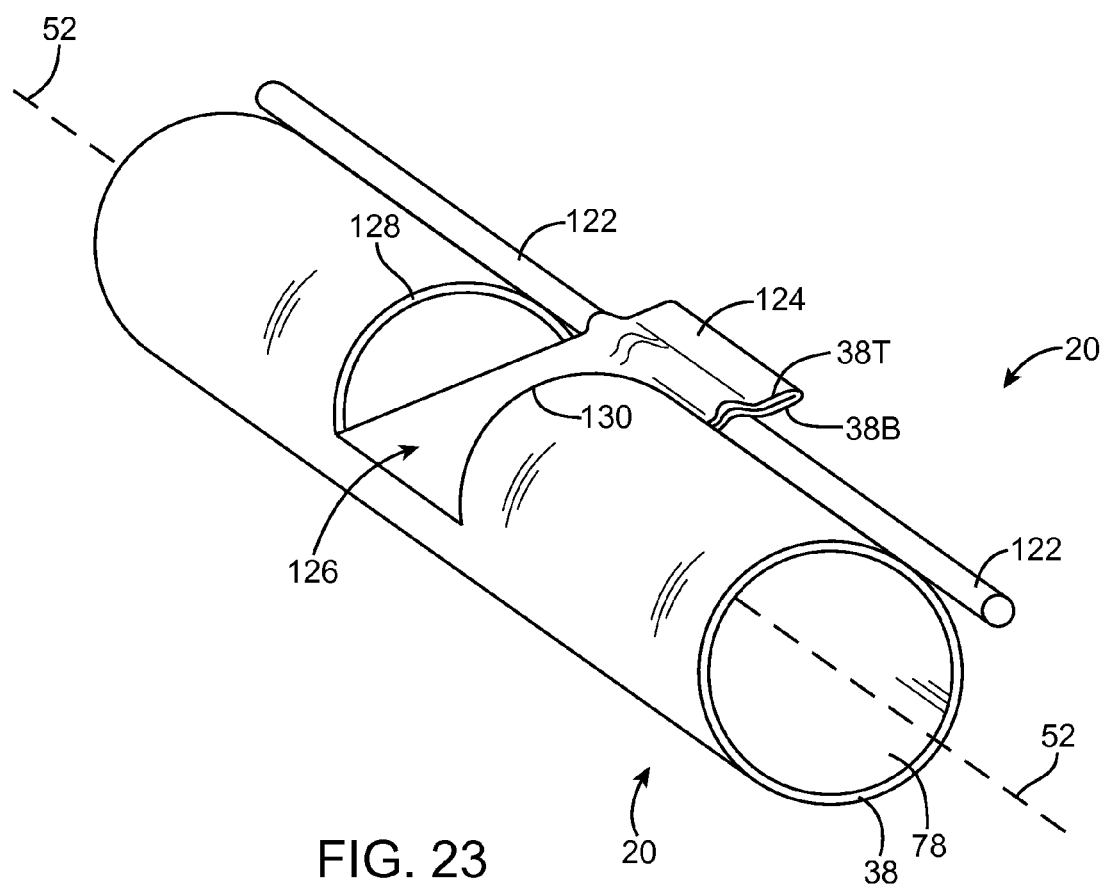
FIG. 23 is a perspective view of a hollow gasket having a portion that is used in covering part of a cable in accordance with an embodiment of the present invention.

FIG. 23 is a perspective view of conductive hollow gasket 20 in a configuration in which gasket 20 has a portion such as flap (flag) 124 that covers part of cable 122. Flap 124 may be formed by cutting an opening in gasket wall 38 such as opening 126. Opening 126 may be formed by cutting wall 38 along edges 128 and 130 and folding the cut portion of wall 38 downwards over cable 122. With this type of arrangement, wire covering flap 124 may include two layers of wall material 38: upper gasket wall layer 38T and lower gasket wall layer 38B, both formed from gasket wall 38. Adhesive may be used to attach flap 124 to structures within device 10 (e.g., conductive structures), thereby securing cable 122 in place.

Figure 24:
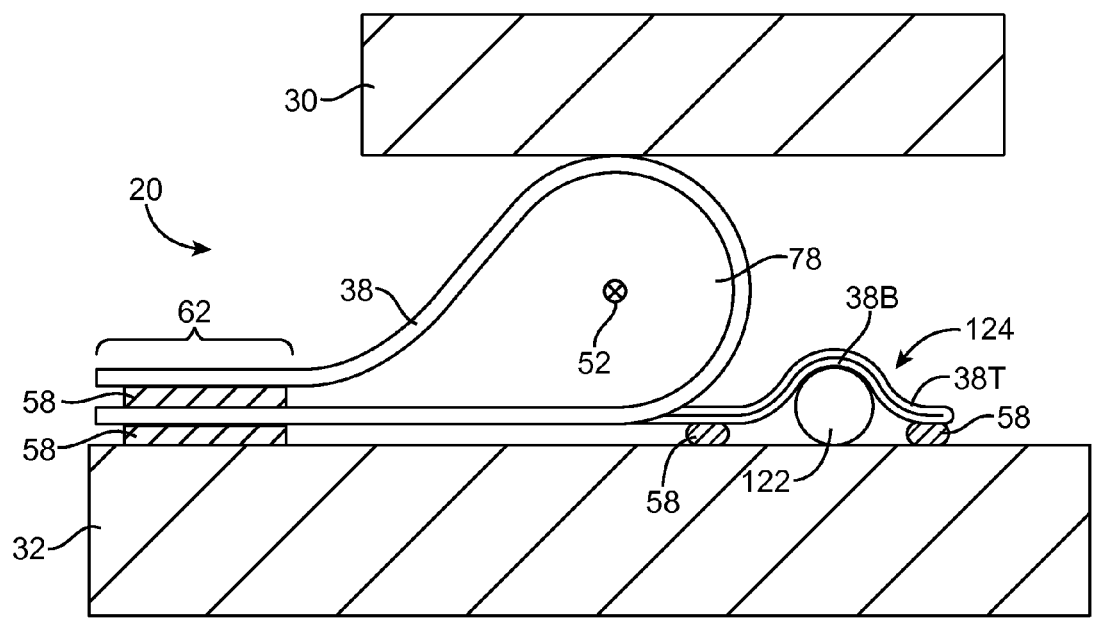
FIG. 24 is a cross sectional view of a hollow gasket of the type shown in FIG. 23 in which part of the gasket has been used in covering a cable that runs parallel to the gasket in accordance with an embodiment of the present invention.

FIG. 24 is a cross sectional view of hollow gasket 20 of FIG. 23 in which part of gasket 20 has been used in forming flap 124 for covering cable 122. Cable 122 may run parallel to longitudinal axis 52 of elongated gasket 20. Gasket 20 may be a straight gasket or a curved gasket and may have one or more flaps such as flap 124 along its length. As shown in FIG. 24, adhesive 58 (e.g., conductive adhesive) may be used in attaching flap 124 to conductive structure 32 over cable 122. Adhesive 58 may also be used in attaching gasket wall 38 to conductive structure 32 in tail region 62 of gasket 20.

Figure 25:
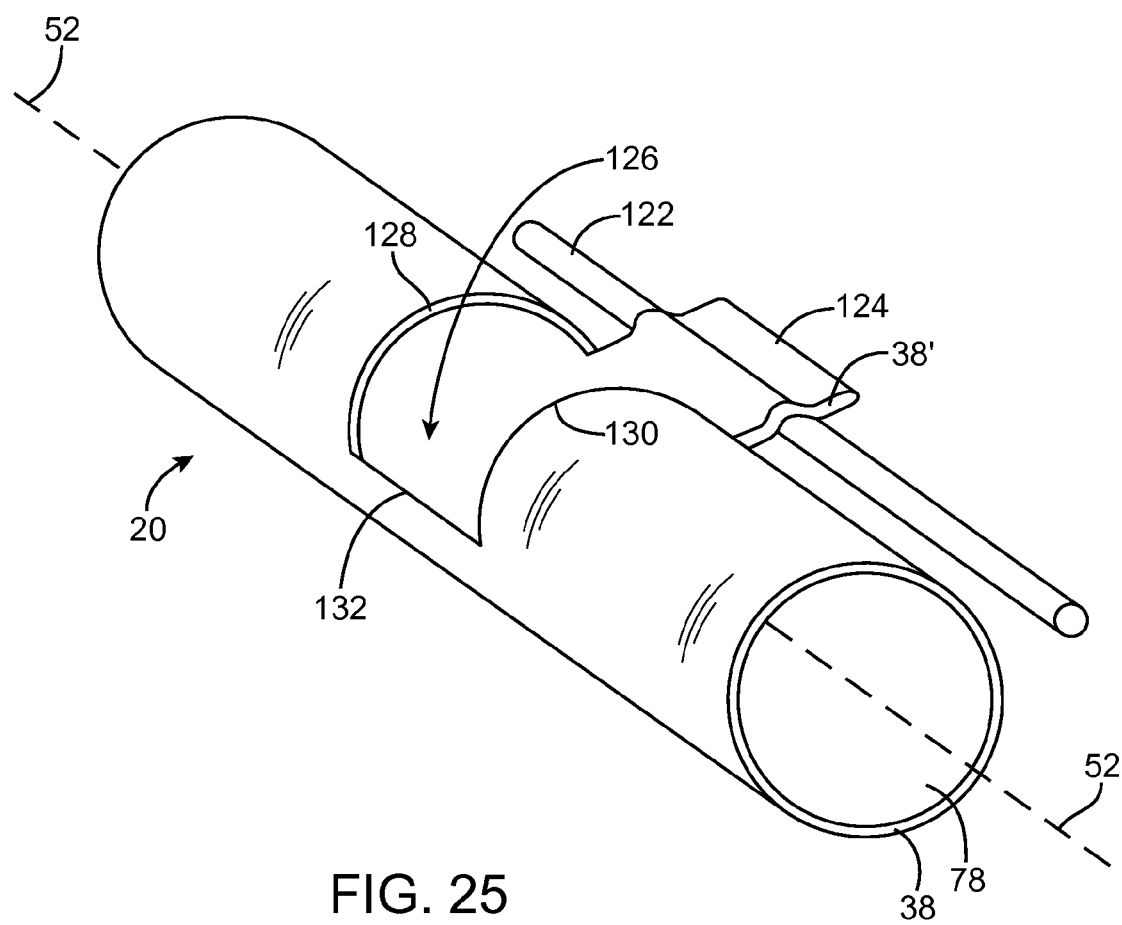
FIG. 25 is a perspective view of another illustrative configuration that may be used for a hollow conductive gasket having a portion that is used in covering a cable that runs parallel to the gasket in accordance with an embodiment of the present invention.

FIG. 25 is a perspective view of another illustrative configuration that may be used to provide hollow conductive gasket 20 with cable-covering flaps. As shown in FIG. 25, flap 124 may be formed by cutting gasket wall 38 along edges 128, 130, and 132, thereby forming a single layer of wall material 38 (i.e., wall material 38') for flap 124.

Figure 26:
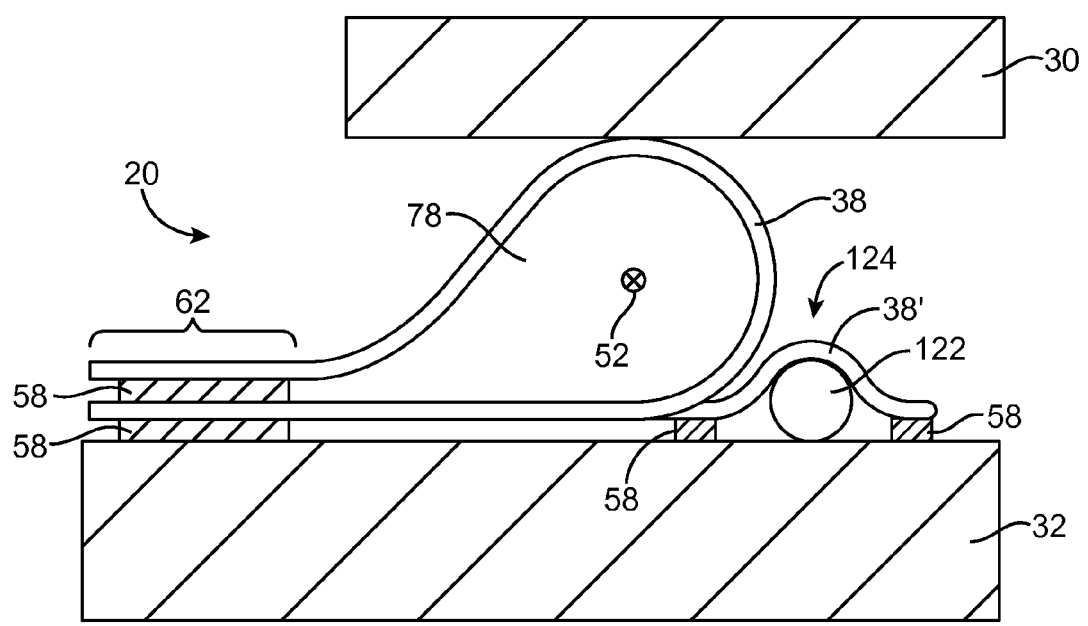
FIG. 26 is a cross sectional side view of a hollow gasket of the type shown in FIG. 25 having a flap of material that covers part of a cable that runs parallel to the gasket in accordance with an embodiment of the present invention.

FIG. 26 is a cross sectional side view of gasket 20 of FIG. 25 showing how flap 124 (formed from gasket wall layer 38') may be used to cover part of cable 122. Adhesive 58 (e.g., conductive adhesive) may be used to attach flap 124 to conductive structure 32 over cable 122.

Figure 27:
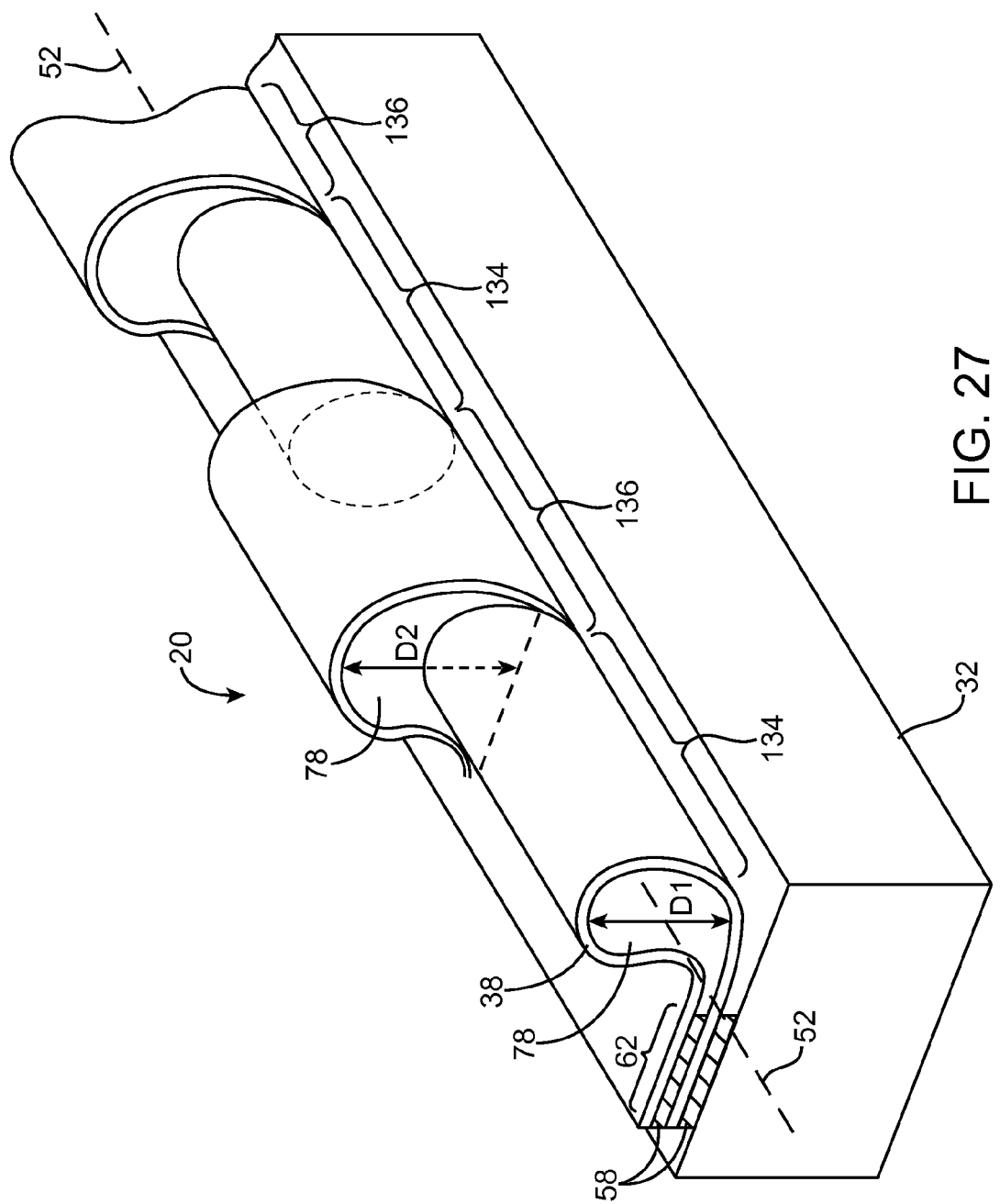
FIG. 27 is a perspective view of a conductive gasket having different diameters at different locations along the length of the conductive gasket in accordance with an embodiment of the present invention.

If desired, different portions of conductive gasket 20 may have different diameters (e.g., to accommodate conductive structures with different air gap widths, etc.). As shown in FIG. 27, for example, gasket 20 may have regions such as regions 134 that are characterized by lateral dimension D1. Dimension D1 may represent the diameter (largest lateral dimension) of gasket 20 in region 134. Gasket 20 may also have regions such as regions 136 that are characterized by lateral dimension D2. Dimension D2 may represent the diameter (largest lateral dimension) of gasket 20 in region 136 and may be different than dimension D1. For example, dimension D2 may be larger than dimension D1. Regions such as regions 134 may alternate with regions such as regions 136 along the length (dimension parallel to longitudinal axis 52) of gasket 20. In the illustrative configuration of FIG. 27, gasket 20 has regions with two different lateral dimensions (i.e., dimensions D1 and D2). If desired, gasket 20 may have three or more different types of regions each with a potentially different maximum lateral dimension (dimension perpendicular to longitudinal dimension 52). The configuration of FIG. 27 in which gasket 20 has longitudinally spaced sections of two different diameters is merely illustrative.

Figure 28:
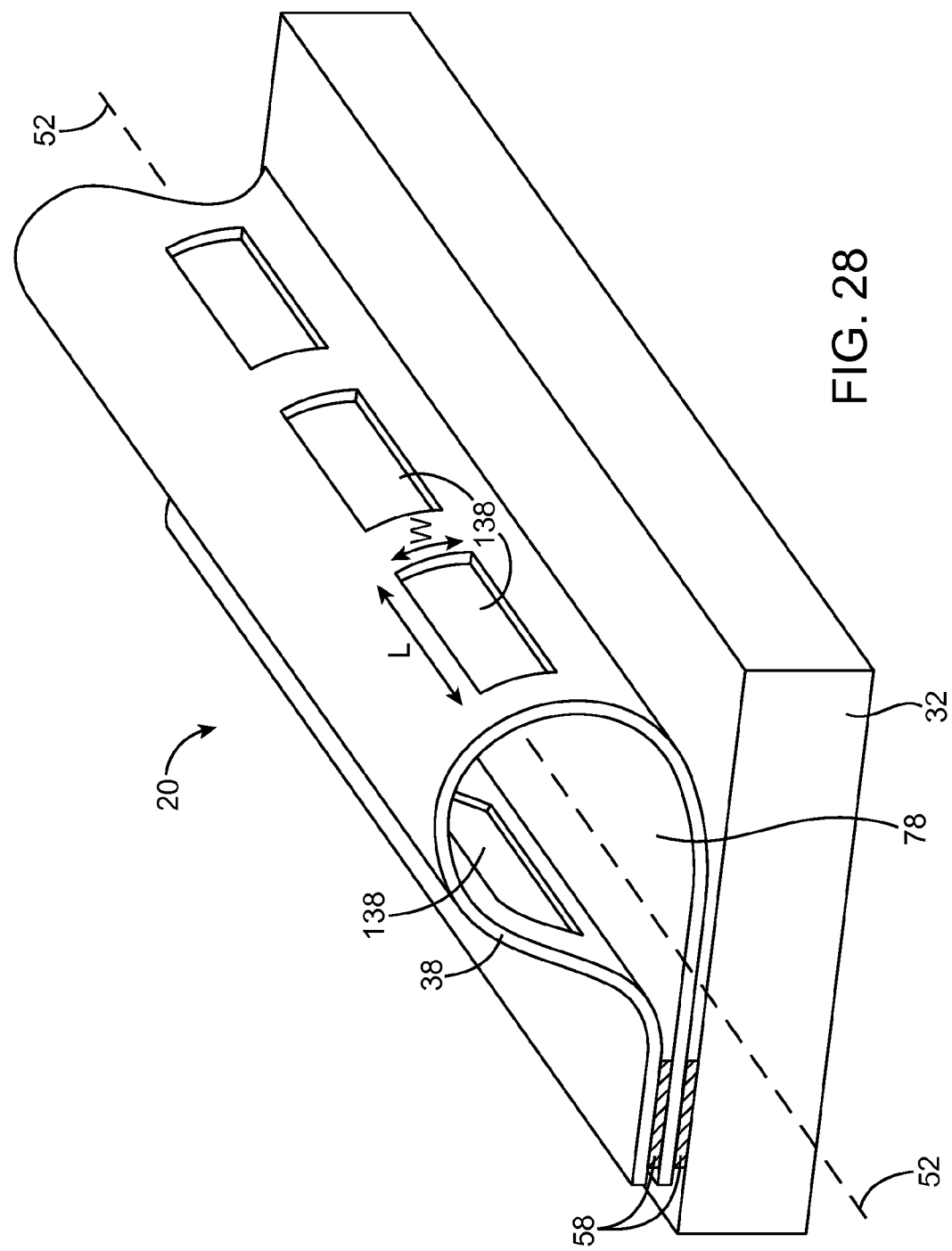
FIG. 28 is a perspective view of a conductive gasket such as a straight conductive hollow gasket having openings that create air passageways through the walls of the gasket in accordance with an embodiment of the present invention.

FIG. 28 is a perspective view of a conductive gasket having openings 138 that create passageways such as passageways for air flow from one side of gasket 20 to another. As shown in FIG. 28, gasket 20 may be formed from gasket wall structures 38 that have been attached to conductive structure 32 using adhesive 58. Gasket 20 may be configured to have a P-shaped cross-sectional shape or other suitable cross section. Openings 138 may be characterized by a length L that runs parallel to longitudinal axis 52 and a width W that is perpendicular to length L (as an example). The length L may, for example, be larger than width W. For example, L may be 0-20 mm, and W may be 0-10 mm, with L>W. If desired, openings 138 may be formed on opposing sides of gasket 20, as shown in FIG. 28, so that air may flow from one side of gasket 20 to the other (as an example). Openings 138 may also accommodate cables and other device structures. Openings 138 may be rectangular, circular, oval, may have shapes with straight edges, shapes with curved edges, or shapes with combinations of straight and curved edges. The rectangular shapes of openings 138 in gasket wall 38 of elongated conductive hollow gasket 20 are merely illustrative.

Figure 29:
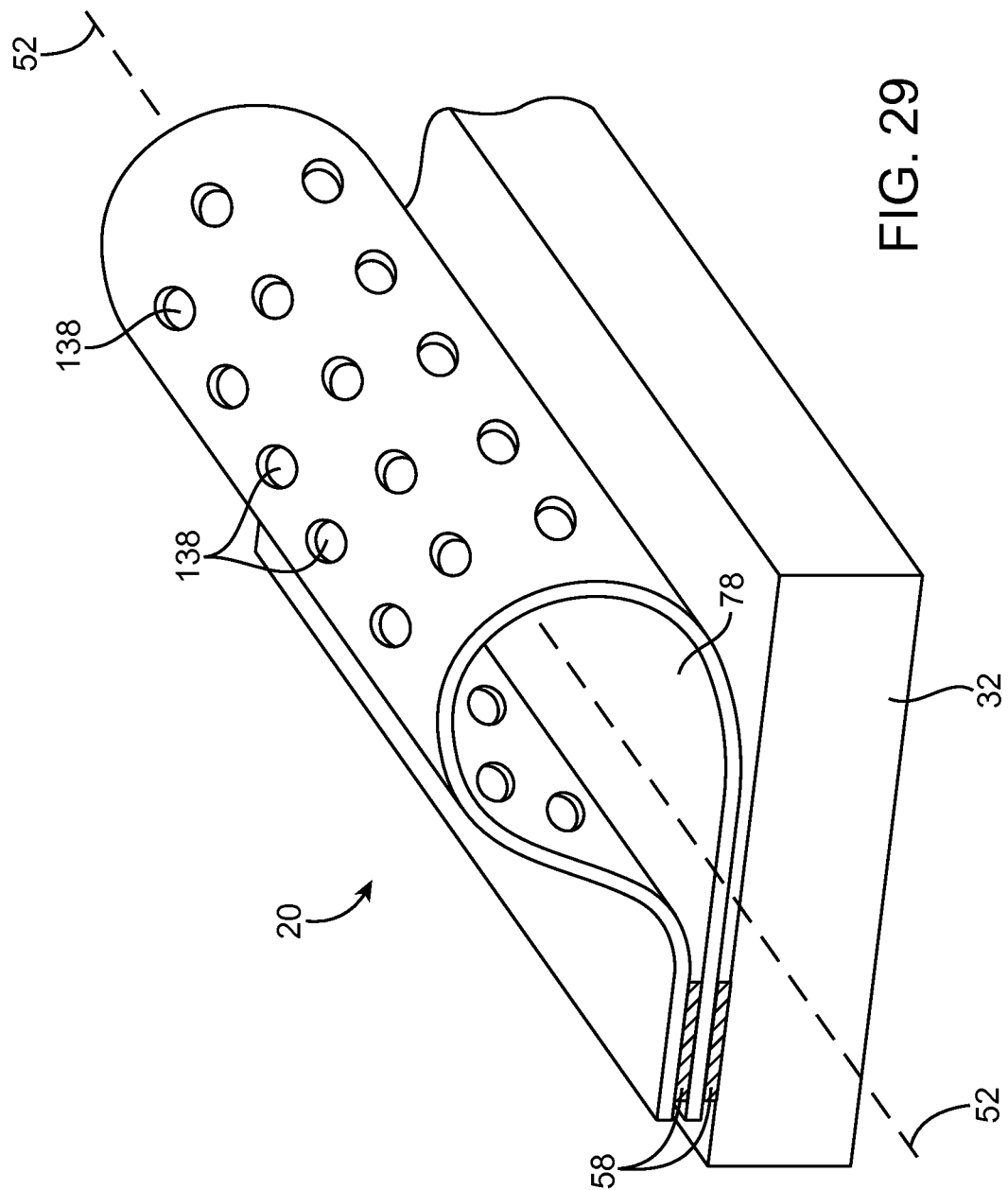
FIG. 29 is a perspective view of a conductive gasket structure having wall structures with perforations in accordance with an embodiment of the present invention.

If desired, conductive gasket 20 may have gasket wall structures 38 that contain openings (e.g., circular opening or openings of other suitable shapes) such as perforations 138 of FIG. 29.

Figure 30:
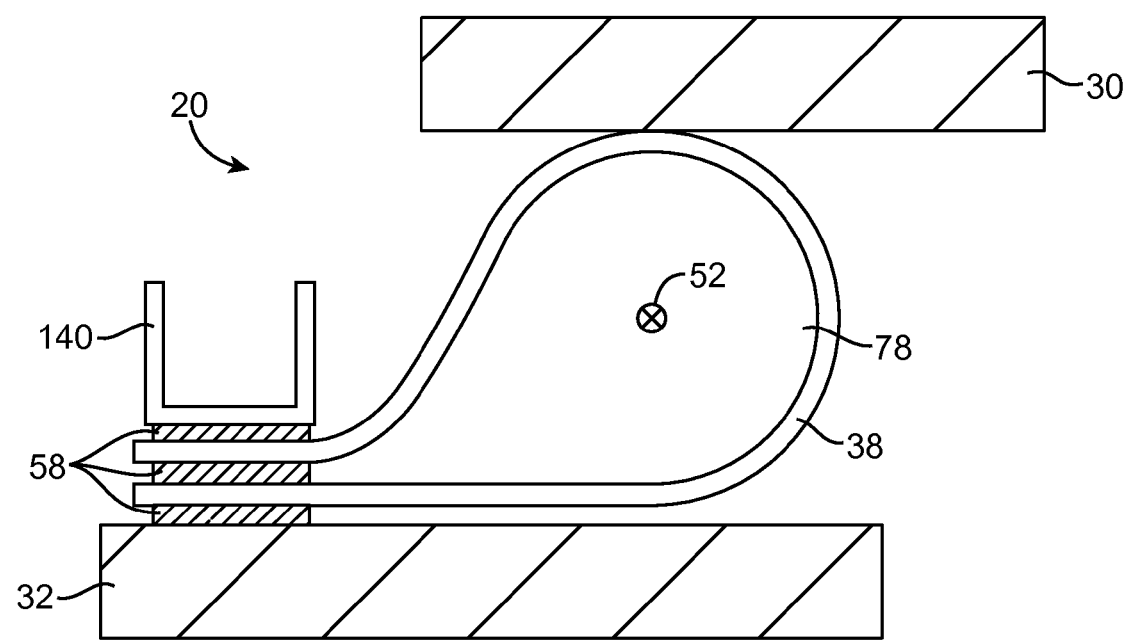
FIG. 30 is a cross-sectional view of a conductive gasket to which a member such as a clip structure has been attached in accordance with an embodiment of the present invention.

As shown in FIG. 30, gasket 20 may be provided with structures such as ancillary member 140. Member 140 may be a bracket, a connector, or other structure. Member 140 may be, as an example, an engagement structure such as a clip for engaging other structures in device 10. A clip or other engagement structure may receive a cable or may serve as a bracket that is configured to hold a component. Member 140 may, if desired, be configured to mate with a corresponding member that is attached to a structure in device 10 (e.g., member 140 may be a clip that attaches to mounting points within device 10 to facilitate attachment of gasket 20 within device 10). Members such as member 140 may be attached to gasket wall structure 38 in gasket 20 using adhesive 58 (e.g., conductive adhesive) or other suitable attachment mechanisms. Members such as member 140 may be formed from plastic, metal, glass, ceramic, carbon-fiber or other fiber-based composites, other materials or combinations of these materials. As an example, members such as member 140 may be formed from stamped sheet metal.

Figure 31:
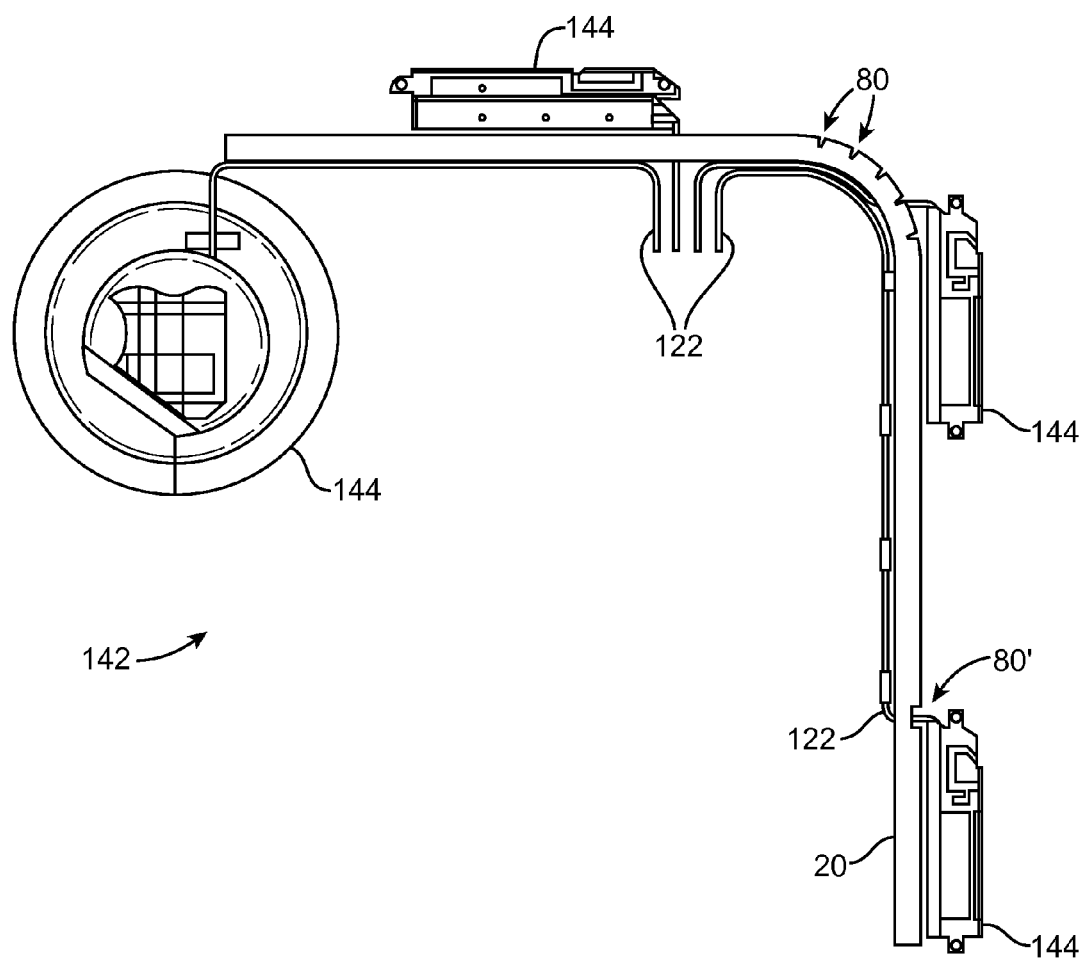
FIG. 31 is a top view of a conductive gasket and associated cables of the type that may be used in the electronic device of FIG. 1 in accordance with an embodiment of the present invention.

A top view of illustrative internal structures in a device such as device 10 of FIG. 1 is shown in FIG. 31. Internal structures 142 may include antennas 144 such as a wireless local area network antenna (e.g., an antenna having a cavity formed form a circular metal can) and cellular telephone antennas (e.g., antennas formed from metal traces on plastic carriers). Cables 122 may include radio-frequency transmission lines for coupling antennas 144 to radio-frequency transceiver circuitry such as radio-frequency transceiver circuitry in components 26 on printed circuit 24 of FIG. 2. Gasket 20 may have openings such as openings 80 to facilitate bending of gasket 20 in curved sections of gasket 20. Openings such as opening 80' may be formed in gasket 20 to accommodate cables 122 (e.g., to allow cable 122 to pass from one side of gasket 20 to another or to enter or exit a length of gasket 20).

Figure 32:
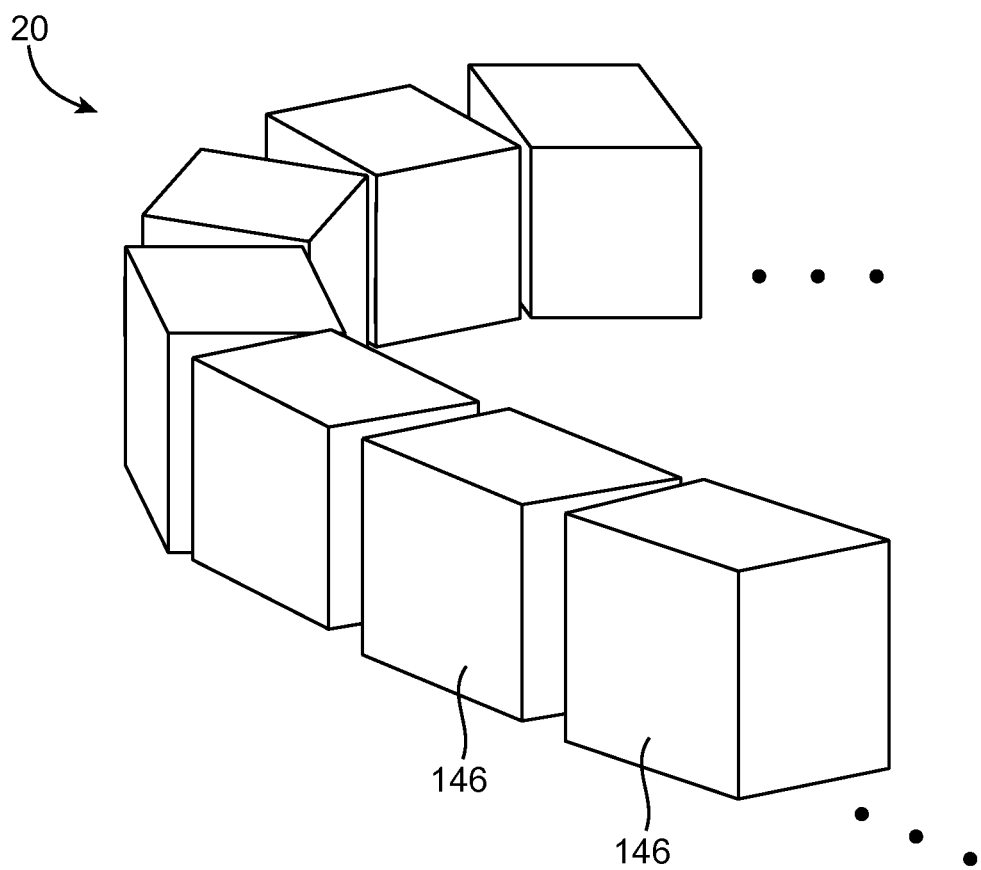
FIG. 32 is a perspective view of a segmented conductive gasket that has been formed from interlocked gasket structures in accordance with an embodiment of the present invention.
Figure 33:
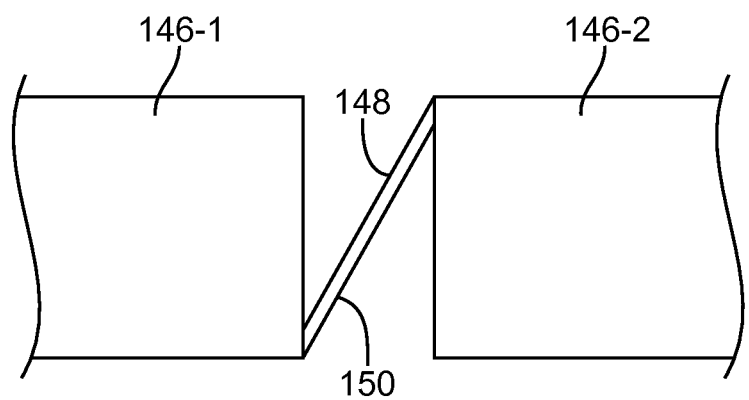
FIG. 33 is a side view of a pair of interlocked gasket segments that may be used in a chain of segmented conductive gaskets of the type shown in FIG. 32 in accordance with an embodiment of the present invention.

In the illustrative example of FIG. 21, segmented gasket 20, includes a spine region such as region 108 that is integral with protruding portions 1120 and 114. If desired, a segmented gasket may be formed by creating individual box-shaped gasket segments that are interconnected through the use of separate interleaved gasket wall structures. This type of arrangement is shown in FIG. 32. As shown in FIG. 32, conductive hollow gasket 20 may be formed from interlocked segments 146. Segments 146 may each be formed from a folded piece of gasket wall material 38 (e.g., a folded patterned sheet of gasket wall material 38). Rather than using an integral spine portion such as spine 108, gasket segments 146 may be interconnected using flaps of gasket material or other structures that engage one another but that are separate from one another. As shown in FIG. 33, for example, gasket segment 146-1 may have flap 150 and gasket segment 146-2 may have flap 148. Flaps 150 and 148 are not part of the same piece of material, but may engage one another to interlock segments 146-1 and 146-2. By interlocking multiple segments 146 in this way, a straight or curved chain of segments 146 may be used to form gasket 20 (FIG. 32).

In general, gaskets with wall openings to form air passageways, gaskets with wall perforations, gaskets with flaps cut out of portions of a gasket wall, gaskets with attached clips or other members, and gaskets with openings to facilitate bending may be formed using a straight configuration in which the gaskets runs parallel to a straight longitudinal axis or may be formed using a curved configuration in which the gaskets run parallel to a curved longitudinal axis and thereby follow a curved path. Gaskets such as these may also be formed that have a combination of these features and a combination of straight and curved portions.

The foregoing is merely illustrative of the principles of this invention and various modifications can be made by those skilled in the art without departing from the scope and spirit of the invention.

What is claimed is:

1. Apparatus, comprising:
    an elongated hollow tubular conductive gasket comprising a gasket wall structure of conductive fabric that extends around a hollow air-filled interior cavity, wherein the conductive fabric comprises woven fibers;
    at least one cable; and
    at least one flap of the conductive fabric that covers part of the cable, wherein the at least one flap extends through the hollow air-filled interior cavity from a first side of the elongated hollow tubular conductive gasket to an opposing second side of the elongated hollow tubular conductive gasket.

2. The apparatus defined in claim 1 wherein the gasket wall structure comprises at least one opening.

3. The apparatus defined in claim 2 wherein the at least one opening comprises a plurality of openings configured to form air passageways through the elongated hollow tubular conductive gasket from one side of the hollow tubular conductive gasket to another.

4. The apparatus defined in claim 1 wherein the cable comprises a transmission line cable coupled to at least one antenna.

5. The apparatus defined in claim 1 wherein the conductive fabric includes openings, wherein the elongated hollow tubular conductive gasket is curved to follow a curved path, and wherein the openings are configured to facilitate bending of the elongated hollow tubular conductive gasket without wrinkling.

6. The apparatus defined in claim 1 further comprising at least one engagement structure attached to the elongated hollow tubular conductive gasket with adhesive.

7. The apparatus defined in claim 6 wherein the engagement structure comprises a sheet metal member.

8. The apparatus defined in claim 7 further comprising a curved strip of material attached to the elongated hollow tubular conductive gasket with adhesive.

9. The apparatus defined in claim 1 wherein the elongated hollow tubular conductive gasket has a length and has regions with different lateral dimensions along the length.

10. The apparatus defined in claim 1 wherein the cable passes through the hollow air-filled cavity.

11. Apparatus, comprising:
    an elongated hollow tubular conductive gasket having a hollow air-filled interior cavity, wherein the elongated hollow tubular conductive gasket comprises a gasket wall structure that extends around the hollow air-filled interior cavity and wherein the gasket wall structure comprises conductive fabric; and
    at least one cable that passes through the hollow-air filled cavity, wherein the cable comprises a transmission line cable coupled to at least one antenna; and
    at least one flap of the conductive fabric that covers at least part of the transmission line cable.

12. An apparatus, comprising:
    opposing conductive structures; and
    an elongated hollow tubular conductive gasket that is configured to form an electrical path when compressed between the opposing conductive structures, wherein the elongated hollow tubular conductive gasket has a conductive gasket wall configured to follow a curved path and wherein the conductive gasket wall comprises openings that facilitate bending of the conductive gasket wall to follow the curved path, wherein the elongated hollow tubular conductive gasket comprises a plurality of hollow conductive gasket segments, wherein the hollow conductive gasket segments are formed from a patterned sheet of conductive material, and wherein the patterned sheet of conductive material includes a curved spine portion and integral protrusions that extend from the curved spine portion.

13. The apparatus defined in claim 12 wherein the conductive material comprises conductive fabric.

14. An apparatus, comprising:
    opposing conductive structures;
    an elongated hollow tubular conductive gasket that is configured to form an electrical path when compressed between the opposing conductive structures, wherein the elongated hollow tubular conductive gasket has a conductive gasket wall configured to follow a curved path and wherein the conductive gasket wall comprises openings that facilitate bending of the conductive gasket wall to follow the curved path, wherein the elongated hollow tubular conductive gasket is at least partly surrounded by the conductive gasket wall, wherein the elongated hollow tubular conductive gasket extends along a curved longitudinal axis, wherein the conductive gasket wall extends around the curved longitudinal axis, wherein the conductive gasket wall has an inner surface and an outer surface and has opposing first and second edge portions that run parallel to the curved longitudinal axis and wherein the inner surface of the conductive gasket wall in the first edge portion is attached to the inner surface of the conductive gasket wall in the second edge portion with adhesive; and at least one cable that passes through the elongated hollow tubular conductive gasket.

15. The apparatus defined in claim 14 wherein the at least one cable comprises a plurality of cables that pass through the elongated hollow tubular conductive gasket.

16. The apparatus defined in claim 14 further comprising a flap in the gasket wall that is configured to cover the at least one cable.

* * * * *